United States Patent
Matsushita

(10) Patent No.: US 9,252,752 B2
(45) Date of Patent: Feb. 2, 2016

(54) CLOCK GENERATION CIRCUIT, PROCESSOR SYSTEM USING SAME, AND CLOCK FREQUENCY CONTROL METHOD

(71) Applicant: Renesas Electronics Corporation, Kawasaki-shi (JP)

(72) Inventor: Rumi Matsushita, Yokohama (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/274,326

(22) Filed: May 9, 2014

(65) Prior Publication Data
US 2014/0247074 A1 Sep. 4, 2014

Related U.S. Application Data

(63) Continuation of application No. 13/431,891, filed on Mar. 27, 2012, now Pat. No. 8,723,576.

(30) Foreign Application Priority Data

Mar. 28, 2011 (JP) .................................. 2011-070908

(51) Int. Cl.
| | |
|---|---|
| H03K 21/00 | (2006.01) |
| H03K 3/012 | (2006.01) |
| H03K 23/66 | (2006.01) |
| G06F 1/06 | (2006.01) |
| G06F 1/08 | (2006.01) |

(52) U.S. Cl.
CPC ........ *H03K 3/012* (2013.01); *G06F 1/06* (2013.01); *G06F 1/08* (2013.01); *H03K 21/00* (2013.01); *H03K 23/667* (2013.01)

(58) Field of Classification Search
None
See application file for complete search history.

(56) References Cited

U.S. PATENT DOCUMENTS

| | | | | |
|---|---|---|---|---|
| 5,389,826 | A * | 2/1995 | Sonobe .......................... | 307/125 |
| 6,614,865 | B1 * | 9/2003 | Ishimi ........................... | 375/373 |
| 7,013,404 | B2 * | 3/2006 | Hanamori ..................... | 713/500 |
| 7,339,405 | B2 * | 3/2008 | Hsieh et al. .................... | 327/99 |

(Continued)

FOREIGN PATENT DOCUMENTS

| | | |
|---|---|---|
| JP | S64-57324 A | 3/1989 |
| JP | H5-19892 A | 1/1993 |

(Continued)

OTHER PUBLICATIONS

Notification of Reason(s) for Refusal dated Jun. 24, 2014, with English translation.

(Continued)

Primary Examiner — Ryan Jager
(74) Attorney, Agent, or Firm — McGinn IP Law Group, PLLC

(57) ABSTRACT

A microcomputer includes a register that stores division ratio setting information, a frequency divider that determines first and second division ratios based on the division ratio setting information, frequency-divides a first clock having a first frequency at the first division ratio, and frequency-divides a second clock having a second frequency at the second division ratio, and a CPU. The first and second division ratios are determined in such a manner that a frequency of the first clock that is frequency-divided at the first division ratio and a frequency of the second clock that is frequency-divided at the second division ratio are made equal to each other.

18 Claims, 19 Drawing Sheets

(56) References Cited

U.S. PATENT DOCUMENTS

| | | | |
|---|---|---|---|
| 8,928,385 B2 * | 1/2015 | Kim et al. | 327/291 |
| 2002/0097101 A1 * | 7/2002 | Kubota | 331/135 |
| 2004/0100310 A1 | 5/2004 | Kurakane | |
| 2005/0218955 A1 * | 10/2005 | Kurd et al. | 327/291 |
| 2006/0017519 A1 * | 1/2006 | Pernia et al. | 331/185 |
| 2006/0091928 A1 | 5/2006 | Kapur | |
| 2008/0211560 A1 | 9/2008 | Lam | |
| 2011/0254602 A1 | 10/2011 | Steiner | |

FOREIGN PATENT DOCUMENTS

| | | | |
|---|---|---|---|
| JP | 08221151 A * | 8/1996 | |
| JP | H8-221151 A | 8/1996 | |
| JP | 10-094019 A | 4/1998 | |
| JP | 2004-171487 A | 6/2004 | |
| JP | 2004-199135 A | 7/2004 | |
| JP | 2005-71203 A | 3/2005 | |
| JP | 2009-146617 A | 7/2009 | |

OTHER PUBLICATIONS

United States Office Action dated Sep. 5, 2013, in U.S. Appl. No. 13/431,891.

Notice of Allowance dated Dec. 31, 2013, in U.S. Appl. No. 13/431,891.

* cited by examiner

| REGISTER VALUE (ss2) | | | SEL211 (FOR ck2) | | SEL212 (FOR ck12) | | SEL213 (FOR ck11) | |
|---|---|---|---|---|---|---|---|---|
| | | | DIVISION RATIO | cks=ck2 =4MHz | DIVISION RATIO | cks=ck12 =16MHz | DIVISION RATIO | cks=ck11 =32MHz |
| 0 | 0 | 0 | $2^0$ | 4MHz | $2^0$ | 16MHz | $2^0$ | 32MHz |
| 0 | 0 | 1 | $2^0$ | 4MHz | $2^0$ | 16MHz | $2^1$ | 16MHz |
| 0 | 1 | 0 | $2^0$ | 4MHz | $2^1$ | 8MHz | $2^2$ | 8MHz |
| 0 | 1 | 1 | $2^0$ | 4MHz | $2^2$ | 4MHz | $2^3$ | 4MHz |
| 1 | 0 | 0 | $2^1$ | 2MHz | $2^3$ | 2MHz | $2^4$ | 2MHz |
| 1 | 0 | 1 | $2^2$ | 1MHz | $2^4$ | 1MHz | $2^5$ | 1MHz |
| 1 | 1 | 0 | $2^3$ | 0.5MHz | $2^5$ | 0.5MHz | $2^6$ | 0.5MHz |
| 1 | 1 | 1 | $2^4$ | 0.25MHz | $2^6$ | 0.25MHz | $2^7$ | 0.25MHz |

Fig. 9

| REGISTER VALUE (ss2) | | | DIVISION RATIO | SEL20 | | |
|---|---|---|---|---|---|---|
| | | | | cks=ck2 =4MHz | cks=ck12 =16MHz | cks=ck11 =32MHz |
| 0 | 0 | 0 | $2^0$ | 4MHz | 16MHz | 32MHz |
| 1 | 0 | 0 | $2^1$ | 2MHz | 8MHz | 16MHz |
| 0 | 1 | 0 | $2^2$ | 1MHz | 4MHz | 8MHz |
| 1 | 1 | 0 | $2^3$ | 0.5MHz | 2MHz | 4MHz |
| 0 | 0 | 1 | $2^4$ | 0.25MHz | 1MHz | 2MHz |
| 1 | 0 | 1 | $2^5$ | 125kHz | 0.5MHz | 1MHz |
| 0 | 1 | 1 | $2^6$ | 62.5kHz | 0.25MHz | 0.5MHz |
| 1 | 1 | 1 | $2^7$ | 31.25kHz | 125kHz | 0.25MHz |

Fig. 13

CLOCK GENERATION CIRCUIT, PROCESSOR SYSTEM USING SAME, AND CLOCK FREQUENCY CONTROL METHOD

CROSS-REFERENCE TO RELATED APPLICATIONS

The present application is a Continuation application of U.S. patent application Ser. No. 13/431,891 filed on Mar. 27, 2012, which is based on and claims priority from Japanese Patent Application No. 2011-070908, filed on Mar. 28, 2011, the entire contents of which are incorporated herein by reference.

BACKGROUND

The present invention relates to a clock generation circuit, a processor system using same, and a clock frequency control method.

In recent years, a low power consumption and long life light emitting diode (LED) has been used more for a lighting system as compared to an incandescent bulb and a fluorescent light. Usually, brightness of the lighting system using such LED (hereinafter referred to as an LED lighting system) can be adjusted by an adjustment lever and a remote control etc. That is, in order to adjust the brightness of LED according to an external control signal, a microcontroller is mounted in the LED lighting system as a processor system provided with a communication function. As a global communication standard of indoor lighting in various institutions etc., DALI (Digital Addressable Lighting Interface) is known. Further, infrared remote controls are often used for the communication in household lighting.

By the way, a reduction in the power consumption of the microcontroller has been required as well. Therefore, the microcontroller is often provided with an operation mode with lower power consumption (hereinafter referred to as a low power consumption mode) than the normal operation mode, such as the standby mode. In the low power consumption mode, a frequency multiplication circuit such as PLL (Phase Locked Loop) stops, and the system operates with a clock signal of a frequency lower than in the normal operation mode. For example, Japanese Unexamined Patent Application Publication No. H10-94019 discloses a data reception apparatus with lower power consumption by reducing the frequency of the clock signal.

On the other hand, in order to maintain the abovementioned communication function, the clock signal for communication (hereinafter referred to as a communication clock signal) needs to maintain the frequency as it is. That is, a clock signal for operating the system (hereinafter referred to as a system clock signal) slows down (switches to a low frequency) with transition to the low power consumption mode. On the other hand, the frequency of the communication clock signal needs to remain constant. In order to synchronize the system clock signal and the communication clock signal, the communication clock signal is generated by dividing the system clock.

Japanese Unexamined Patent Application Publication No. 2004-171487 discloses a technique to maintain the frequency of the clock signal supplied to an LCD (Liquid Crystal Display) controller to be constant in the low power consumption mode by setting the multiple rate to 1/N and then setting the division ratio of a frequency divider provided in a subsequent stage of the PLL to 1/N. Japanese Unexamined Patent Application Publication No. 2004-199135 discloses a technique to divide the system clock that is generated by multiplying the reference clock signal, and generates the clock signal having the same phase and frequency of the reference clock signal. After the multiple rate of the system clock signal is detected, the system clock signal is divided according to the detected multiple rate.

SUMMARY

The present inventor has found a following problem.

In the technique disclosed by Japanese Unexamined Patent Application Publication No. 2004-171487, after setting the multiple rate of the PLL to 1/N, the division ratio of the frequency divider provided in the subsequent stage of the PLL is set to 1/N. Therefore, there has been a problem in which after the multiple rate of the PLL is set to 1/N and until the division ratio of the frequency divider provided in the subsequent stage is set to 1/N, the frequency of the clock signal supplied to the LCD controller cannot be maintained to a desired frequency.

In the technique disclosed by Japanese Unexamined Patent Application Publication No. 2004-199135, after the multiple rate of the system clock signal is detected, the frequency of the system clock signal is divided according to the detected multiple rate. Accordingly, there has been a problem in which at least after the multiple rate of the system clock signal is switched and until the multiple rate of the system clock signal is detected, the clock signal of a desired frequency cannot be obtained.

When Japanese Unexamined Patent Application Publication Nos. 2004-171487 and 2004-199135 are applied to the abovementioned communication clock signal, after the frequency of the system clock is switched, it is not possible to communicate for a predetermined period. Specifically, there has been a problem in which the communication responsiveness at the time of switching the frequency of the system clock signal deteriorates.

An aspect of the present invention is a clock generation circuit that includes a system clock selection circuit that selects one of a first and a second clock signals as a system clock signal according to a selection signal, in which the first and the second clock signals have different frequencies from each other, a frequency division circuit that divides the system clock signal and generates a plurality of divided clock signals, and a communication clock selection circuit that selects a communication clock signal from the plurality of divided clock signals according to the selection signal and a division ratio setting signal, and switches to the selected communication clock signal in synchronization with a switching timing of the selection signal.

Another aspect of the present invention is a processor system that includes an operation circuit, an input and output circuit that is connected to the operation circuit via a bus, and a clock generation circuit that supplies a communication clock to the input and output circuit while supplying a system clock to the operation circuit. The clock generation circuit includes a system clock selection circuit that selects one of a first and a second clock signals as the system clock signal according to a selection signal, in which the first and the second clock signals have different frequencies from each other, a frequency division circuit that divides the system clock and generates a plurality of divided clock signals, and a communication clock selection circuit that selects a communication clock signal from the plurality of divided clock signals according to the selection signal and a division ratio setting signal, and switches to the selected communication clock signal in synchronization with a switching timing of the selection signal.

Another aspect of the present invention is a clock frequency control method that includes selecting one of a first and a second clock signals as a system clock signal according to a selection signal, in which the first and the second clock signals have different frequencies from each other, dividing the system clock signal and generating a plurality of divided clock signals, and selecting a communication clock signal from the plurality of divided clock signals according to the selection signal and a division ratio setting signal, synchronizing with a switching timing of the selection signal, and switching to the selected communication clock signal.

The present invention includes the communication clock selection circuit that selects a communication clock signal from the plurality of divided clock signals according to the selection signal and the division ratio setting signal, and switches to the selected communication clock signal in synchronization with a switching timing of the selection signal. Therefore, after the frequency of the system clock signal is switched, communication will not be impossible for a predetermined period.

The present invention can improve the communication responsiveness at the time of switching the frequency of the system clock signal.

BRIEF DESCRIPTION OF THE DRAWINGS

The above and other aspects, advantages and features will be more apparent from the following description of certain embodiments taken in conjunction with the accompanying drawings, in which:

FIG. 9 is a table showing division ratios and frequencies in selectors SEL211, SEL212, and SEL213 corresponding to register values (division ratio setting signal ss2);

FIG. 13 is a table showing division ratios and frequencies in the selector SEL20 corresponding to register values (division ratio setting signal ss2);

DETAILED DESCRIPTION

Hereinafter, specific embodiments incorporating the present invention are explained in detail with reference to the drawings. However, the present invention is not necessarily limited to the following embodiments. In order to explain clearly, the following description and the drawings are simplified as appropriate.

First Embodiment

First, an outline of a processor system incorporating the present invention is explained. Although the present invention is applied to the processor system explained below, the processor system to be explained is an example and the present invention can be applied to other processor systems.

Figure 1:
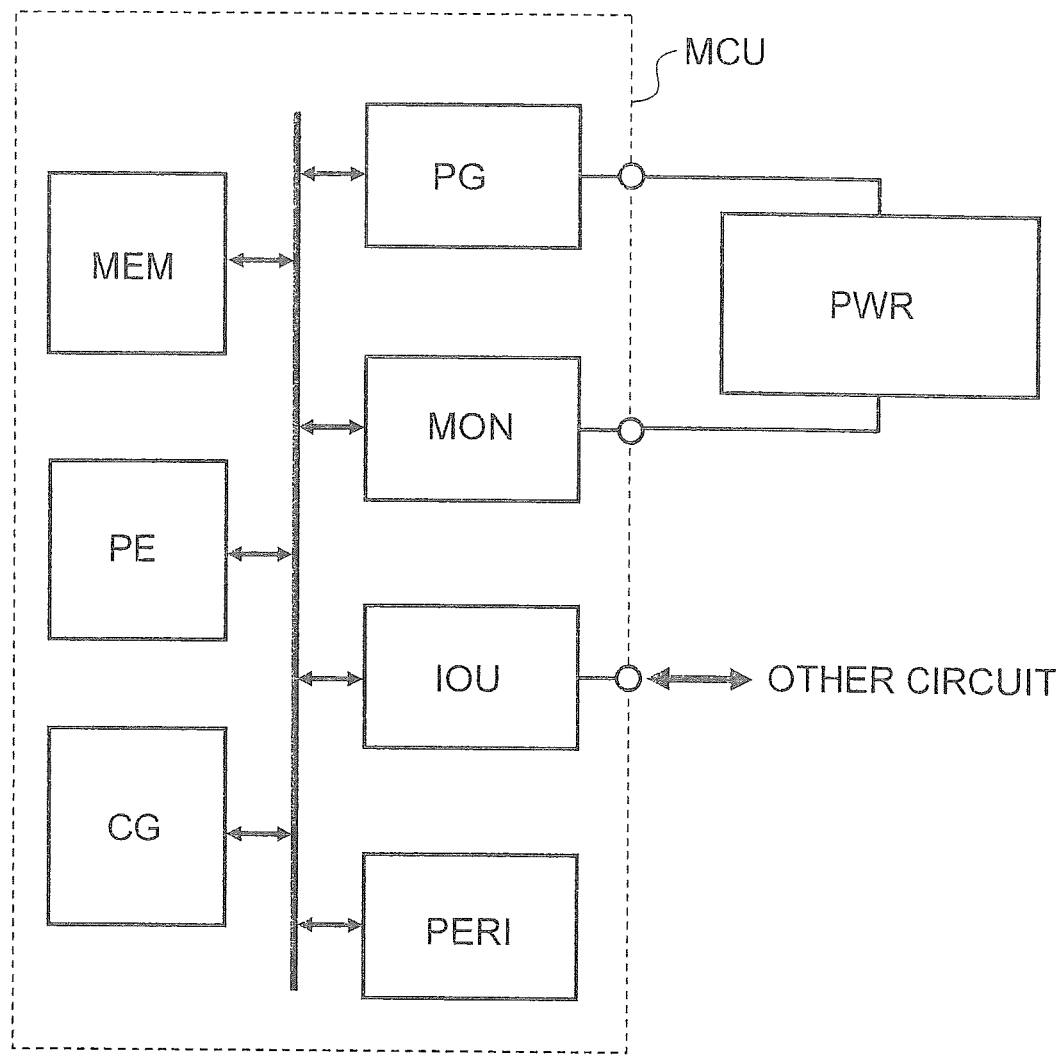
FIG. 1 is a schematic diagram of a processor system MCU incorporating the present invention.

FIG. 1 shows a schematic diagram of a processor system MCU incorporating the present invention. As shown in FIG. 1, a processor system MCU according to the present invention includes a memory MEM, an operation core PE, a clock generation unit CG, a PWM signal generation unit PG, an output monitor unit MON, an IO unit IOU, and a peripheral circuit PERI. FIG. 1 also shows a controlled system circuit PWR that is controlled by the processor system MCU. This controlled system circuit PWR is for example a power supply circuit that generates a boosted voltage, which is the power supply voltage boosted according to a PWM signal generated by the PWM signal generation unit PG, or a step-down voltage, which is the stepped-down power supply voltage, and supplies the generated voltages to other circuits.

The memory MEM stores programs used by the processor system MCU and setting values used to operate the processor system MCU. The operation core PE performs specific processes required by the processor system MCU based on the program stored to the memory MEM or the program read from outside. The clock generation unit CG generates the clock signal used in each circuit block in the processor system MCU. Further, the clock signal generated by the clock generation unit CG may be output outside. The clock signal used within the processor system MCU can also be supplied from an external circuit.

The PWM signal generation unit PG generates the PWM signal to be output outside. This PWM signal generation unit PG can also be realized by using the timer function of the processor system MCU, for example. Further, the PWM signal generation unit PG may be mounted as a functional circuit different from the timer function.

The output monitor unit MON monitors the voltage of a node of the external circuit. Then, the output monitor unit MON converts the voltage including an analog value into a digital value. The output monitor unit MON transmits the digital value to the inside of the processor system MCU. In the example of FIG. 1, the output voltage of the power supply circuit provided outside is monitored and a digital value according to the level of the output voltage can be taken into the processor system MCU. This output monitor unit MON can be composed of a circuit capable of converting an analog value into a digital value, such as an analog digital converter (for example, ADC), a comparator circuit or the like.

The IO unit IOU performs communication between the circuits provided outside, and receives control signals or the like from the processor system MCU or transmits a processing result of the processor system MCU, for example. As a specific example of the IO unit IOU, there are an SPI unit, UART unit, etc. Note that the SPI unit performs communication of the SPI (System Packet Interface) standard which is the serial communication of three or four lines. Further, the UART (Universal Asynchronous Receiver Transmitter) unit converts a serial signal of the start/stop synchronization system into a parallel signal, and converts in the opposite direction.

The peripheral circuit PERI is a circuit other than the circuit block mentioned above, and includes the circuit block used by the operation core PE. As the peripheral circuit PERI, there are, for example, a timer unit, a watchdog timer unit, a DMA (Direct Memory Access) unit, a low voltage detection unit, a power-on reset (POR) unit, etc.

Note that in the processor system MCU incorporating the present invention, the operation core PE, the memory MEM, the PWM signal generation unit PG, the PWM signal generation unit PG, the output monitor unit MON, the IO unit IOU, and the peripheral circuit PERI are mutually connected by buses. Although not shown, power is supplied to the processor system MCU from other circuits. The processor system MCU explained so far is an example of the processor system incorporating the present invention, and the program and data stored to the memory MEM, for example, can be modified as appropriate according to the specification of the system. Further, the circuit blocks may be connected via a plurality of buses, for example, or the operation core PE and other circuit block may be directly connected without a bus.

The processor system MCU can generate the PWM signal and supplies the PWM signal to the controlled circuit PWR. Then, the processor system MCU can control a duty of this PWM signal or a generation timing of the PWM signal, for example, by the voltage of the node in the controlled circuit and a control signal or the like supplied from other circuits. Therefore, in order to clarify the application of the PWM signal generated by the processor system MCU, the power supply circuit, which is an example of the controlled circuit PWR, is explained. Although the power supply circuit explained below drives LED (Light Emitting Diode) as a load circuit, the load circuit is not limited to LED but may be a general circuit.

FIGS. 2A to 2D show examples of the power supply circuit that drive LED. Note that in FIGS. 2A to 2D, the power supply circuits are denoted by the code PWR. Further, the power supply circuit PWR shown in FIG. 2A to FIG. 2D uses an NMOS transistor as an output transistor that performs a switching operation. However, the output transistor can be composed of a PMOS transistor, a PNP transistor, or an NPN transistor.

Figure 2A:
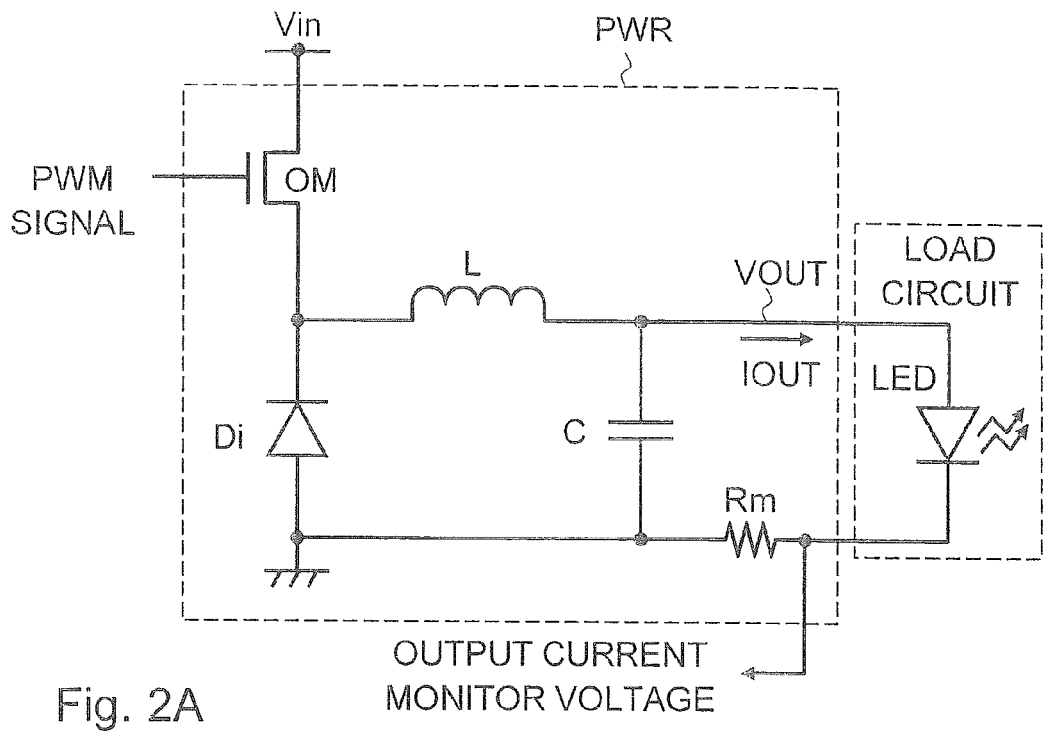
FIG. 2A is a circuit diagram of a power supply circuit that drives LED.

The power supply circuit PWR shown in FIG. 2A is a stepped-down power supply circuit. The power supply circuit PWR includes an NMOS transistor OM, an inductor L, a diode Di, a capacitor C, and a resistor Rm. The drain of the NMOS transistor OM is connected to a power supply terminal supplied with an input voltage Vin, and the source of the NMOS transistor OM is connected to the cathode of the diode Di. Further, the PWM signal is supplied to the gate of the NMOS transistor OM, and the NMOS transistor OM performs the switching operation according to the voltage level of the PWM signal. The anode of the diode Di is connected to a ground terminal. One end of the inductor L is connected to a node between the source of the NMOS transistor OM and the cathode of the diode Di. The capacitor C is connected between the other end of the inductor L and the ground terminal. Then, an output voltage VOUT according to the charge amount stored to the capacitor C is generated in a node between one end of the capacitor C and the other end of the inductor L. Moreover, the charge stored to the capacitor C is supplied to LED as an output current IOUT. The resistor Rm is connected between the cathode of LED and the ground terminal. The output current IOUT flowing into the LED flows in this resistor Rm. That is, a voltage according to the output current IOUT and the resistance value of the resistor Rm is generated in the both ends of the resistor Rm. This voltage is supplied to the output monitor unit MON of the processor system MCU as an output current monitor voltage. Then, the processor system MCU generates the PWM signal including a duty ratio or a frequency that keeps the voltage level of the output current monitor voltage constant. That is, when the power supply circuit PWR shown in FIG. 2A is used, the processor system MCU and the power supply circuit PWR compose a circuit that drives LED at a constant current.

Figure 2B:
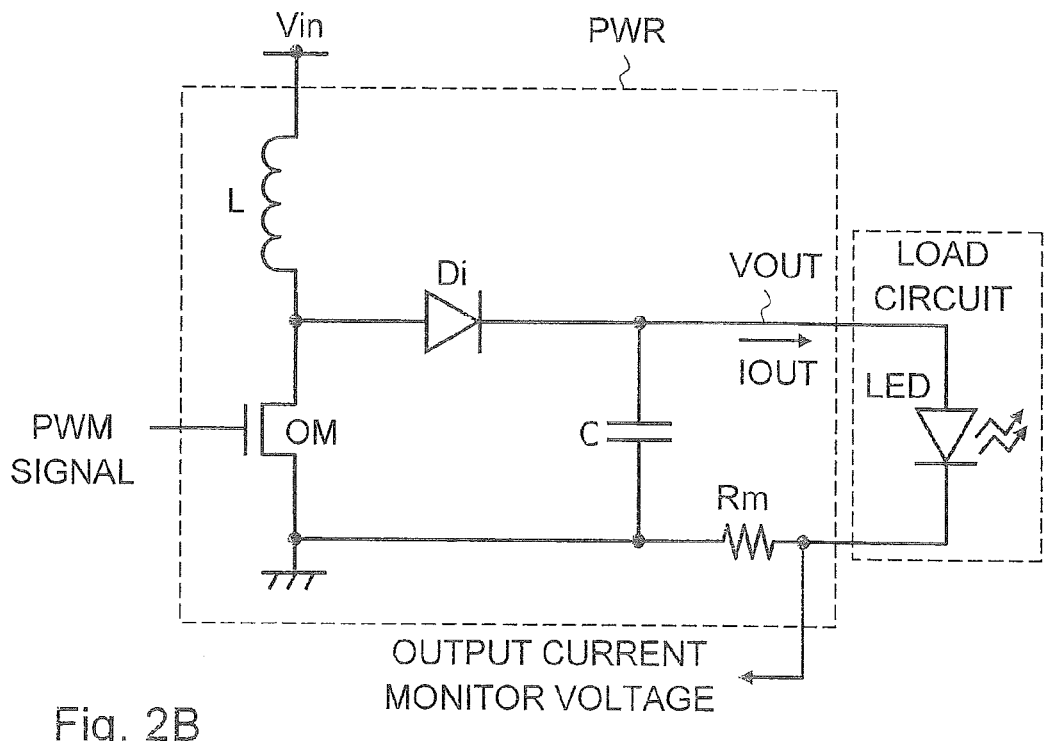
FIG. 2B is a circuit diagram of a power supply circuit that drives LED.

The power supply circuit PWR shown in FIG. 2B is a boost type power supply circuit. The power supply circuit PWR includes an NMOS transistor OM, an inductor L, a diode Di, a capacitor C, and a resistor Rm. One end of the inductor is connected to a power supply terminal, that is supplied with an input voltage Vin. The drain of the NMOS transistor OM is connected to the other end of the inductor L, and the source of the NMOS transistor OM is connected to a ground terminal. Further, the PWM signal is supplied to the gate of the NMOS transistor OM, and the NMOS transistor OM performs the switching operation according to the voltage level of the PWM signal. The anode of the diode Di is connected to a node between the other end of the inductor L and the drain of the NMOS transistor OM. The capacitor C is connected between the cathode of the diode Di and the ground terminal. Then, an output voltage VOUT according to the charge amount stored to the capacitor C is generated in a node between one end of the capacitor C and the cathode of the diode Di. Moreover, the charge stored to the capacitor C is supplied to LED as an output current IOUT. The resistor Rm is connected between the cathode of LED and the ground terminal. The output current IOUT flowing into the LED flows in this resistor Rm. That is, the voltage according to the output current IOUT and the resistance value of the resistor Rm is generated in the both ends of the resistor Rm. This voltage is supplied to the output monitor unit MON of the processor system MCU as an output current monitor voltage. Then, the processor system MCU generates the PWM signal including a duty ratio or a frequency that keeps the voltage level of the output current monitor voltage constant. That is, when the power supply circuit PWR shown in FIG. 2B is used, the processor system MCU and the power supply circuit PWR compose a circuit that drives LED at a constant current.

Figure 2C:
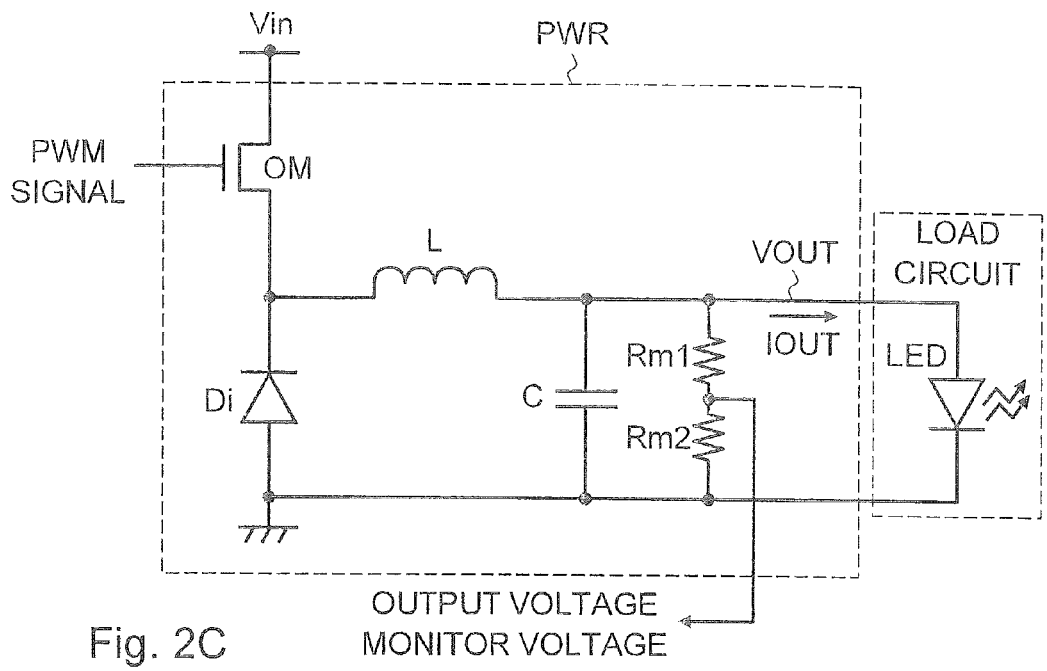
FIG. 2C is a circuit diagram of a power supply circuit that drives LED.

The power supply circuit PWR shown in FIG. 2C is a stepped-down type power supply circuit. The power supply circuit PWR includes an NMOS transistor OM, an inductor L, a diode Di, a capacitor C, and resistors Rm1 and Rm2. The drain of the NMOS transistor OM is connected to a power supply terminal that is supplied with an input voltage Vin, and the source of the NMOS transistor OM is connected to the cathode of the diode Di. Further, the PWM signal is supplied to the gate of the NMOS transistor OM, and the NMOS transistor OM performs the switching operation according to the voltage level of the PWM signal. The anode of the diode Di is connected to a ground terminal. One end of the inductor L is connected to a node between the source of the NMOS transistor OM and the cathode of the diode Di. The capacitor C is connected between the cathode of the diode Di and the ground terminal. Then, an output voltage VOUT according to the charge amount stored to the capacitor C is generated in a node between one end of the capacitor C and the other end of the inductor L. Moreover, the charge stored to the capacitor C is supplied to LED as an output current IOUT. The resistors Rm1 and Rm2 are connected in series to be parallel with LED. That is, the output voltage VOUT applied to the both ends of LED is supplied to the both ends of the resistors Rm1 and Rm2. Then, the output voltage monitor voltage, which is obtained by dividing the output voltage VOUT by a resistance ratio of the two resistors, is output from a node between the resistors Rm1 and Rm2. This voltage is supplied to the output monitor unit MON of the processor system MCU as the output voltage monitor voltage. Then, the processor system MCU generates the PWM signal including a duty ratio or a frequency that keeps the voltage level of the output current monitor voltage constant. Specifically, when the power supply circuit PWR shown in FIG. 2C is used, the processor system MCU and the power supply circuit compose the circuit that drives LED at a constant voltage.

Figure 2D:
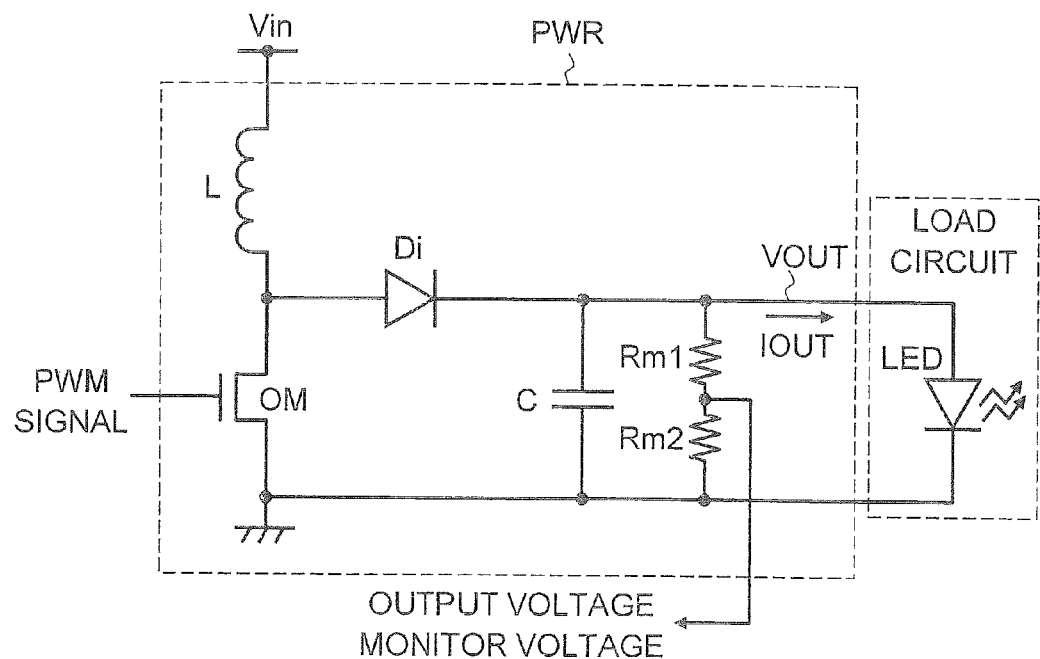
FIG. 2D is a circuit diagram of a power supply circuit that drives LED.

The power supply circuit PWR shown in FIG. 2D is a boost type power supply circuit. The power supply circuit PWR includes an NMOS transistor OM, an inductor L, a diode Di, a capacitor C, and resistors Rm1 and Rm2. One end of the inductor is connected to a ground terminal that is supplied with an input voltage Vin. The drain of the NMOS transistor OM is connected to the other end of the inductor L, and the source of the NMOS transistor OM is connected to a ground terminal. Further, the PWM signal is supplied to the gate of the NMOS transistor OM, and the NMOS transistor OM performs the switching operation according to the voltage level of the PWM signal. The anode of the diode Di is connected to a node between the other end of the inductor L and the drain of the NMOS transistor OM. A capacitor C is connected between the cathode of the diode Di and the ground terminal. Then, an output voltage VOUT according to the charge amount stored to the capacitor C is generated in a node between one end of the capacitor C and the cathode of the diode Di. Moreover, the charge stored to the capacitor C is supplied to LED as an output current IOUT. The resistors Rm1 and Rm2 are connected in series to be parallel with LED. That is, the output voltage VOUT applied to both ends of LED is supplied to the both ends of the resistors Rm1 and Rm2. Then, the output voltage monitor voltage, which is obtained by dividing the output voltage VOUT by a resistance ratio of the two resistors, is output from a node between the resistors Rm1 and Rm2. This voltage is supplied to the output monitor unit MON of the processor system MCU as the output voltage monitor voltage. Then, the processor system MCU generates the PWM signal including a duty ratio or a frequency that keeps the voltage level of the output current monitor voltage constant. Specifically, when the power supply circuit PWR shown in FIG. 2D is used, the processor system MCU and the power supply circuit compose the circuit that drives LED at a constant voltage.

The explanation of the abovementioned processor system MCU is for the entire configuration of the processor system incorporating the present invention. However, in the explanation of the embodiment of the present invention, the components not explained in the explanation of the above processor system MCU are added as appropriate. The explanation for the added components is also added as appropriate.

Figure 3:
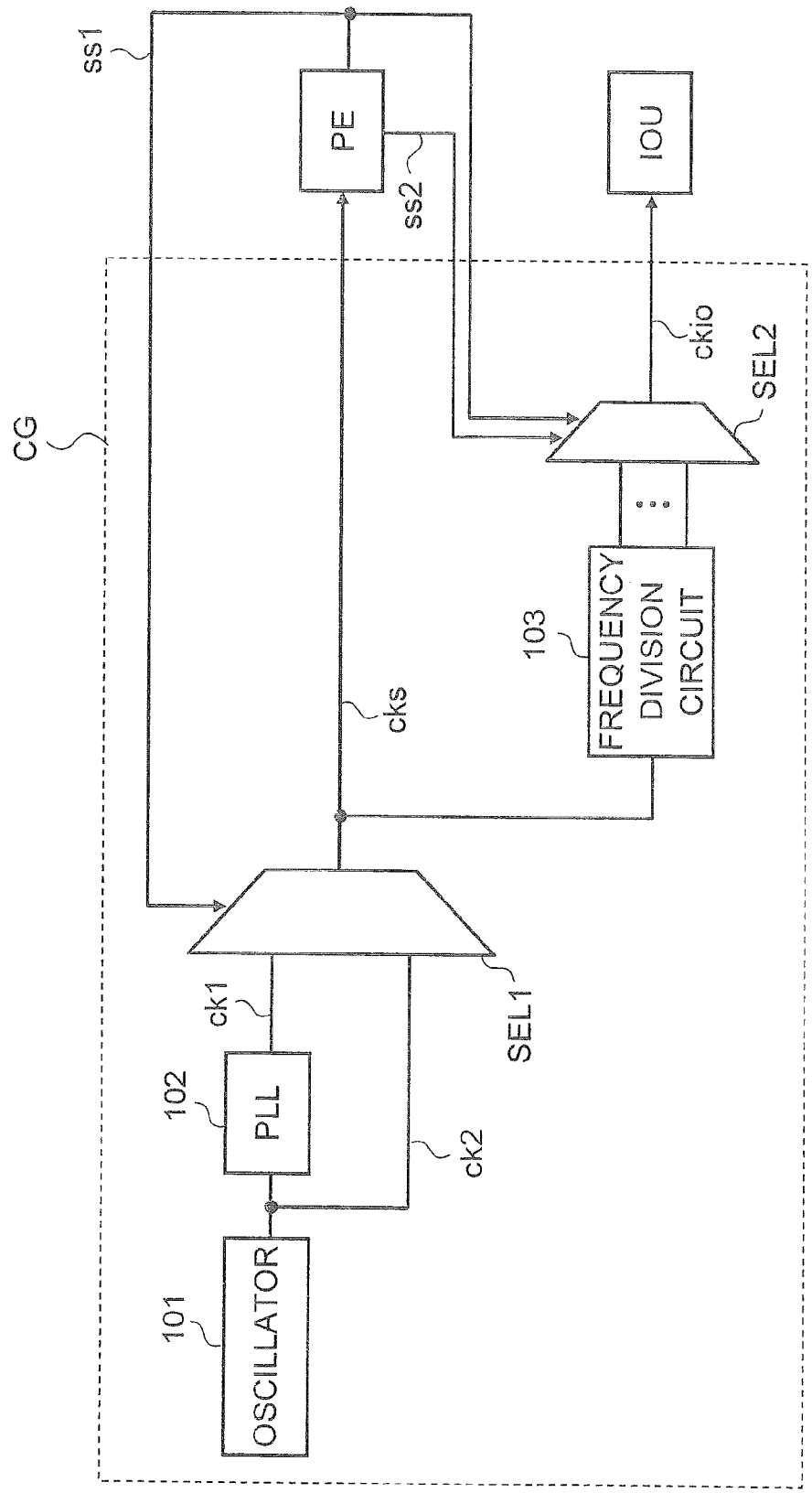
FIG. 3 is a block diagram of a clock generation unit CG according to a first embodiment.

Next, the clock generation unit CG according to the first embodiment of the present invention is explained with reference to FIG. 3. FIG. 3 is a block diagram of the clock generation unit CG according to the first embodiment. As shown in FIG. 3, the clock generation unit CG includes selectors SEL1 and SEL2, an oscillator 101, a PLL circuit 102, and a frequency division circuit 103.

The oscillator 101 is a crystal oscillator for example, and outputs a reference clock signal ck2 with a constant frequency.

The PLL circuit 102 is a frequency multiplication circuit that multiplies the reference clock signal ck2 output from the oscillator 101k, and generates a higher speed (higher frequency) clock signal ck1 than the reference clock signal ck2.

The selector SEL1 selects a system clock signal cks from the reference clock signal ck2 and the clock signal ck1 according to a system clock selection signal ss1 output from the operation core PE. The system clock signal cks is supplied to the operation core PE. The system clock selection signal ss1 switches according to the operation mode. For example, in the normal operation mode, the system clock selection signal ss1 is set to L (Low), and the high-speed clock signal ck1 is selected as the system clock cks. On the other hand, in the low power consumption mode, the system clock selection signal ss1 is set to H (High), and the low-speed reference clock signal ck2 is selected as the system clock signal cks.

The system clock signal cks is input to the frequency division circuit 103, and the frequency of this system clock signal cks is divided by a plurality of frequency dividing ratios. That is, the frequency division circuit 103 generates a plurality of divided clock signals.

The selector SEL2 selects a communication clock signal ckio from a plurality of divided clock signals output from the frequency division circuit 103 according to the system clock selection signal ss1 and a frequency dividing ratio setting signal ss2 that are output from the operation core PE. The communication clock signal ckio is supplied to the IO unit IOU.

The system clock selection signal ss1 input to the selector SEL2 reveals which signal is selected as the system clock signal cks. Therefore, the division ratio of the divided clock signal selected by the selector SEL2 is switched at the same time when the system clock selection signal ss1 is switched, so that the frequency of the communication clock signal ckio can be maintained. For example, suppose that the system clock signal cks switches to the reference clock signal ck2 from the clock signal ck1, and the frequency becomes 1/N (N: natural number). In this case, the selector SEL2 switches to select the divided clock signal with the division ratio of 1/N times (that is, the frequency is N times). Therefore, the frequency of the communication clock signal ckio can be maintained.

Figure 4:
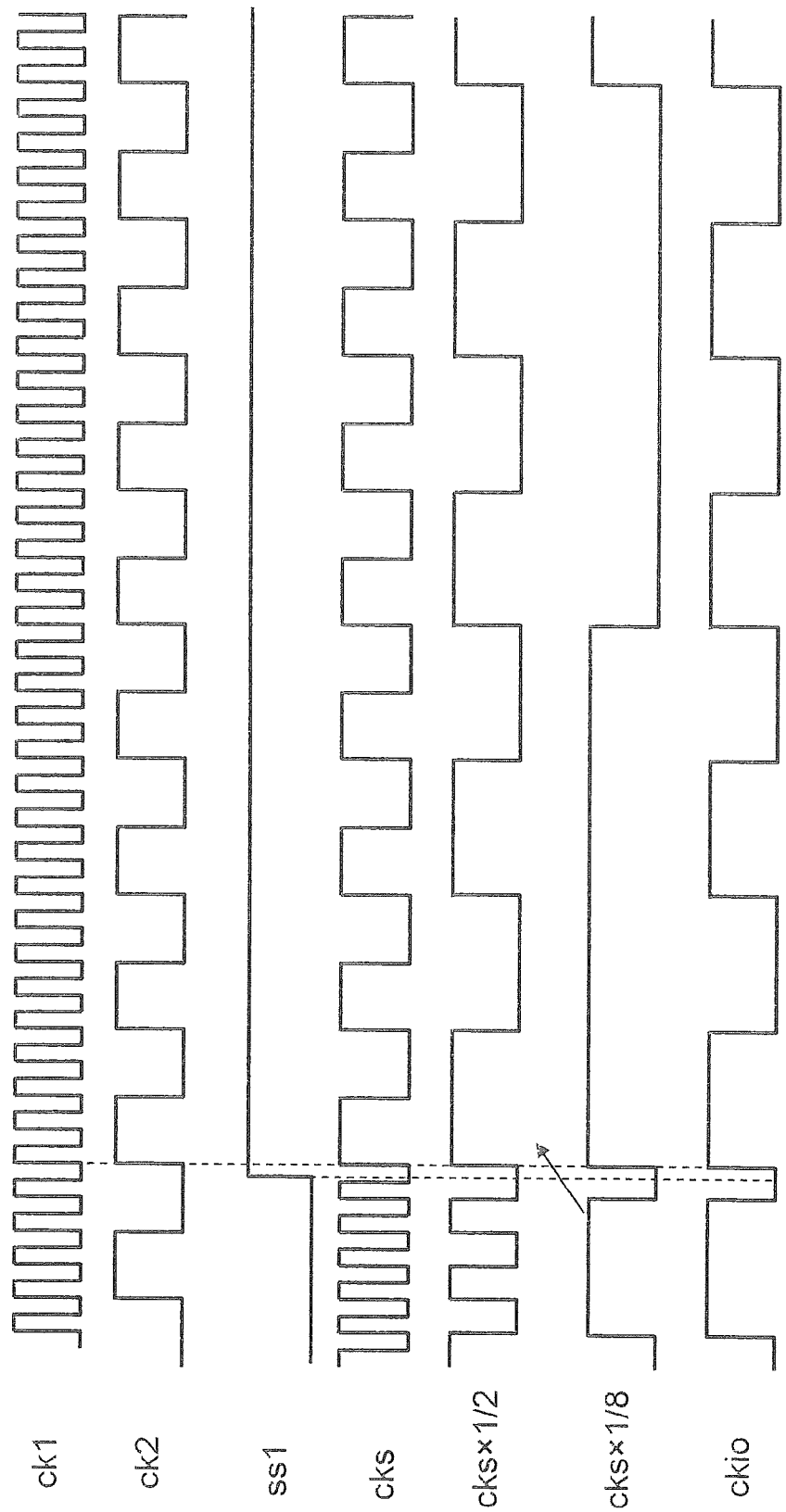
FIG. 4 is a timing chart for explaining an operation of the clock generation unit CG.

Next, an operation of the clock generation unit CG is explained using FIG. 4. FIG. 4 is a timing chart for explaining the operation of the clock generation unit CG. From top of FIG. 4, the clock signal ck1, the reference clock signal ck2, the system clock selection signal ss1, the system clock signal cks, a signal obtained by dividing the system clock signal cks by two, a signal obtained by dividing the system clock signal cks by eight, and the communication clock signal ckio are shown.

As shown in FIG. 4, the clock signal ck1 shown in the first column includes four times the frequency of the reference clock signal ck2 shown in the second column. When the system clock selection signal ss1 shown in the third column is L, the clock signal ck1 shown in the first column is selected by the selector SEL1 as the system clock signal cks shown in the fourth column. On the other hand, when the system clock selection signal ss1 shown in the third column switches to H, the reference clock signal ck2 shown in the second column is selected by the selector SEL1 as the system clock signal cks shown in the fourth column.

"The signal obtained by dividing the system clock cks by two" shown in the fifth column and "the signal obtained by dividing the system clock signal cks by eight" are generated by the frequency division circuit 103. When the system clock selection signal ss1 shown in the third column is L, "the signal obtained by dividing the system clock signal cks by eight" shown in the sixth column is selected by the selector SEL2 as the communication clock signal ckio shown in the seventh column (bottom column). On the other hand, when the system clock selection signal shown in the third column switches to H, "the signal obtained by dividing the system clock signal cks by two" shown in the fifth column is selected by the selector SEL2 as the communication clock signal ckio shown in the seventh column (bottom column).

As shown in FIG. 4, at the same time when the system clock selection signal ss1 shown in the third column switches, the division ratio of the divided clock signal selected by the selector SEL2 also switches. At the time of switch, although there may be a deviation for one cycle at most could be generated in the communication clock signal ckio depending on the switching timing, the deviation is within the communication error range, and thereby not causing a problem.

Figure 5:
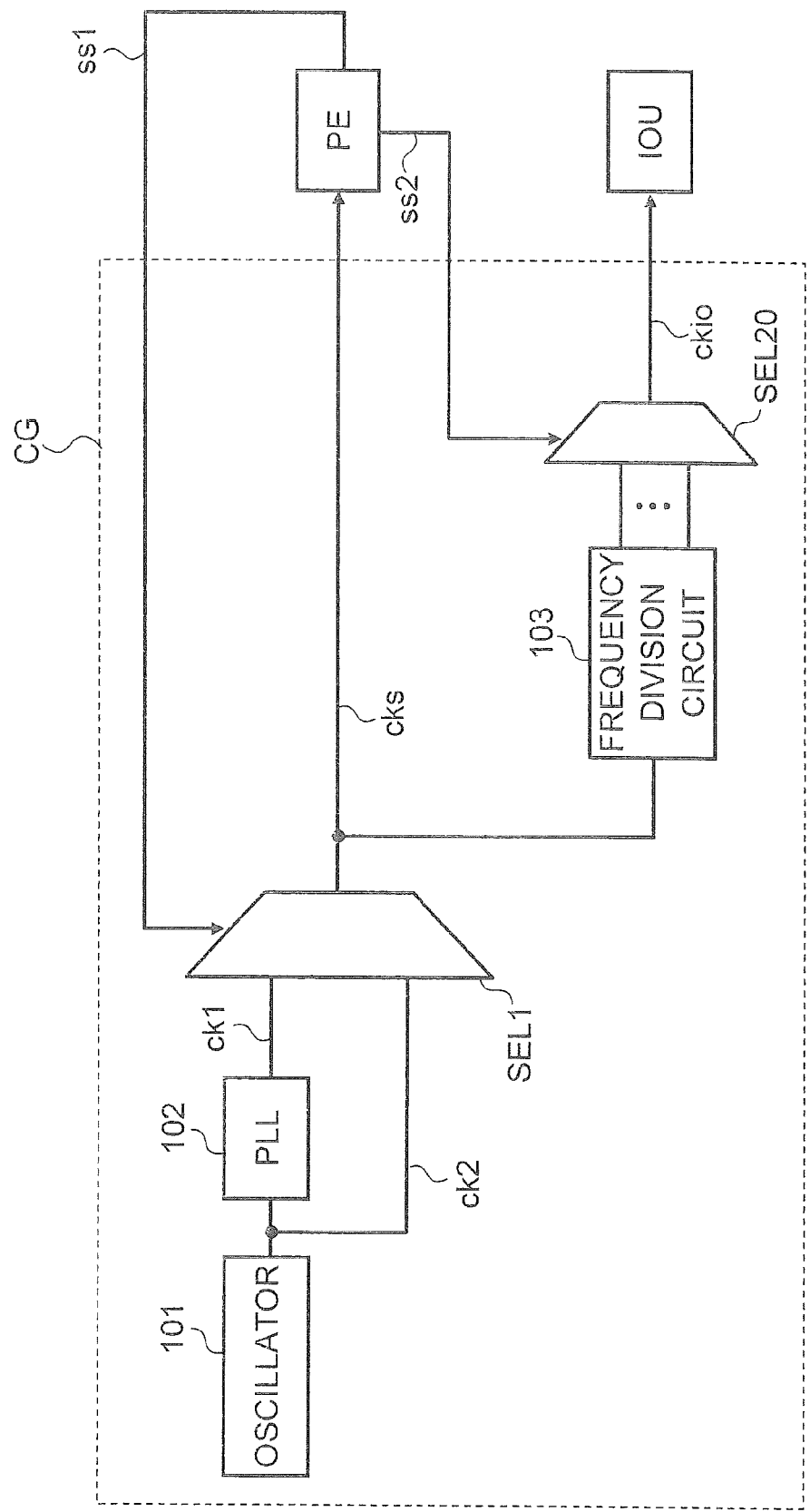
FIG. 5 is a block diagram of the clock generation unit CG according to a comparative example of the first embodiment.

Next, a comparative example according to this embodiment is explained using FIG. 5. FIG. 5 is a block diagram of the clock generation unit CG according to the comparative example of the first embodiment. In FIG. 5, a selector SEL20 is provided instead of the selector SEL2 of FIG. 3. Only the division ratio setting signal ss2 is input to this selector SEL20, and the system clock selection signal ss1 is not input. Therefore, at the same time when the system clock selection signal ss1 switches, the division ratio of the divided clock signal selected by the selector SEL2 cannot be switched. That is, there is a period generated that is not possible to communicate for a predetermined period. As other configuration is similar to FIG. 3, the explanation is omitted.

Figure 6:
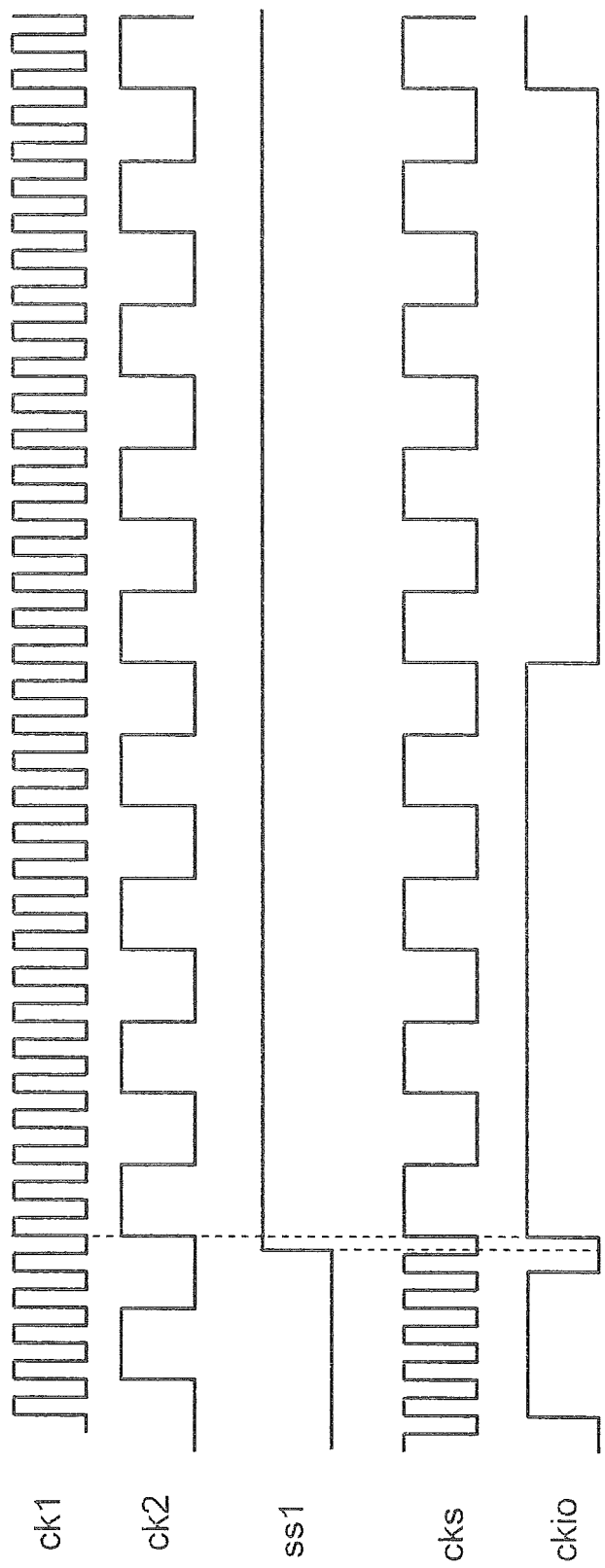
FIG. 6 is a timing chart for explaining the operation of the clock generation unit CG according to the comparative example of FIG. 5.

Next, an operation of the clock generation unit CG according to the comparative example of FIG. 5 is explained using FIG. 6. FIG. 6 is a timing chart for explaining the operation of the clock generation unit CG according to the comparative example of FIG. 5. From the top of FIG. 6, the clock signal ck1, the reference clock signal ck2, the system clock selection signal ss1, the system clock signal cks, and the communication clock signal ckio are shown.

In FIG. 6, since the signals from the clock signal ck1 shown in the first column to the system clock signal cks shown in the fourth column are same as the signals in FIG. 4 from the clock signal ck1 shown in the first column to the system clock signal cks shown in the fourth column, the explanation is omitted. As shown in FIG. 6, in the comparative example, the communication clock signal ckio shown in the fifth (bottom) column remains to be the signal obtained by dividing the system clock cks by eight even when the system clock selection signal ss1 shown in the third column switches from L to H. Note that this signal is the same as the signal shown in the sixth column of FIG. 4.

Therefore, the frequency of the communication clock signal ckio cannot be maintained at the same time when the system clock selection signal ss1 switches. Usually, before switching the system clock selection signal ss1, the output of the communication clock signal ckio is suspended and after switching the system clock selection signal ss1, the division ratio selected by the division ratio setting signal ss2 is switched, and the output of the communication clock signal ckio is resumed. In this way, the frequency of the system clock signal cks is maintained. That is, there is a period generated that is not possible to communicate for a predetermined period.

As described above, in the clock generation unit CG according to the comparative example, when the frequency of the system clock signal cks switches, the period is generated that is not possible to communicate for a predetermined period. On the other hand, in the clock generation unit CG according to this embodiment, the system clock selection signal ss1 is also input to the selector SEL2. Therefore, at the same time when the frequency of the system clock signal cks switches, the division ratio selected by the selector SEL2 also switches, and the frequency of the communication clock signal ckio can be maintained. Accordingly, there is no period generated that is not possible to communicate, and excellent communication responsiveness is achieved.

Second Embodiment

Figure 7:
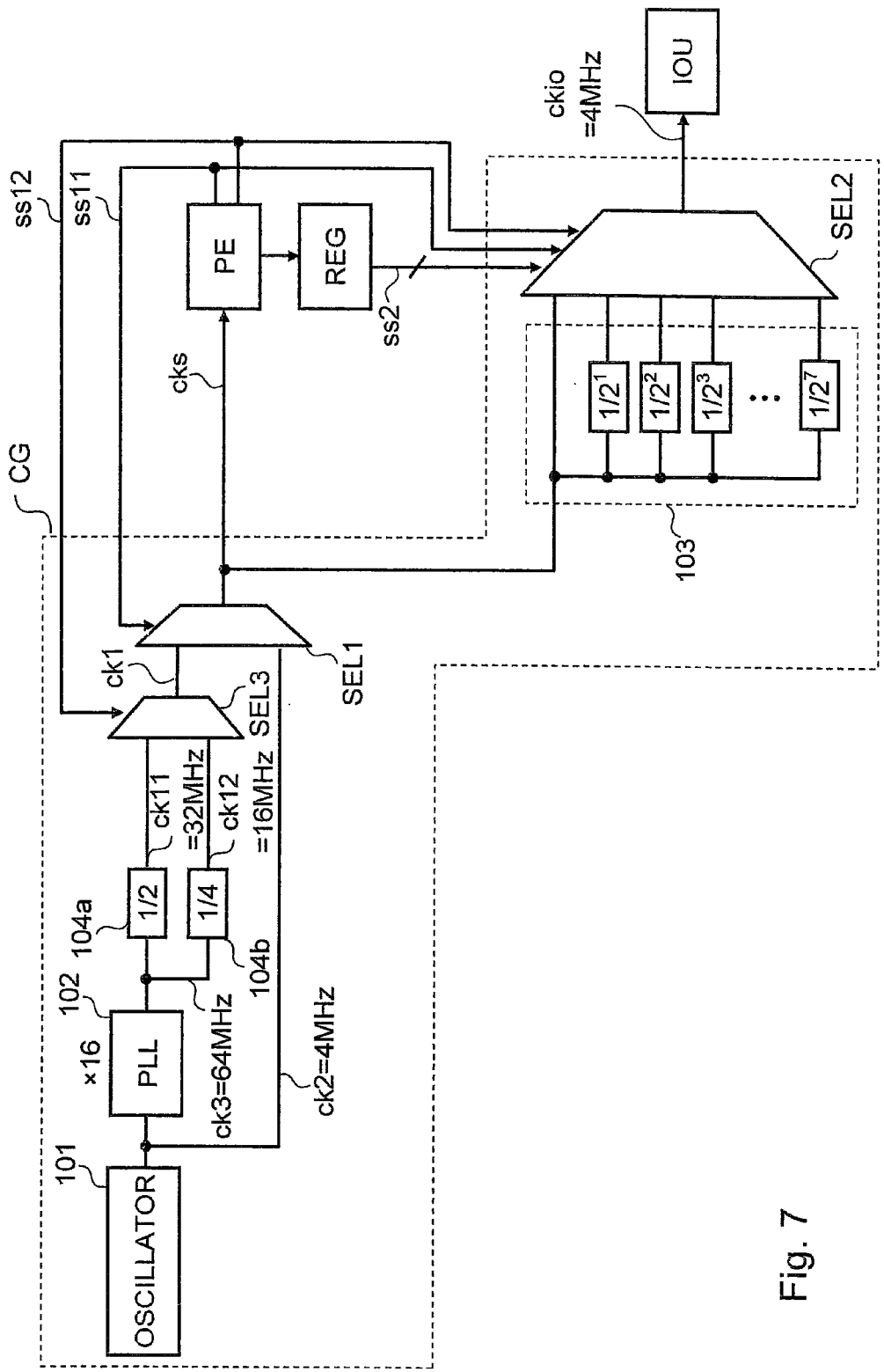
FIG. 7 is a block diagram of the clock generation unit CG according to a second embodiment.

Next, a clock generation unit CG according to a second embodiment is explained using FIG. 7. FIG. 7 is a block diagram of the clock generation unit CG according to the second embodiment. As shown in FIG. 7, the clock generation unit CG includes selectors SEL1, SEL2, SEL3, an oscillator 101, a PLL circuit 102, and frequency division circuits 103, 104a, and 104b. Note that specific numeral values such as a frequency, a division ratio, and a multiple rate are examples for easier understanding of the present invention, and they are not especially limited to these numeral values.

In FIG. 7, suppose that the 4 MHz reference clock signal ck2 is output from the oscillator 101, for example. The PLL circuit 102 multiplies the reference clock signal ck2 output from the oscillator 101 by 16 times, for example, and generates a 4×16=64 MHz clock signal ck3.

The clock signal ck3 output from the PLL circuit 102 is input to the frequency division circuit 104a with the division ratio two and a frequency division circuit 104b with the frequency dividing ratio two.

From the frequency division circuit 104a, a 64 MHz× ½=32 MHz clock signal ck11 is output. From the frequency division circuit 104b, a 64 MHz×¼=16 MHz clock signal ck12 is output.

The selector SEL3 selects the clock signal ck1 from the clock signal ck11 and the clock signal ck12 according to a second system clock selection signal ss12 output from the operation core PE.

The selector SEL1 selects the clock signal cks from the clock signal ck2 and the clock signal ck1 according to a first system clock selection signal ss11 output from the operation core PE. The system clock signal cks is supplied to the operation core PE.

The first system clock selection signal ss11 switches according to the operation mode. For example, in the normal operation mode, the first system clock selection signal ss11 is set to L, and the high-speed clock signal ck1 is selected as the system clock signal cks. On the other hand, in the low power consumption mode, the first system clock selection signal ss11 is set to H, and the low-speed clock signal ck2 is selected as the system clock signal cks. In the normal operation mode in which the first system clock selection signal ss11 is L, when the second system clock selection signal ss12 is H, the 32 MHz clock signal ck11 is selected as the clock signal ck1, while when the second system clock selection signal ss12 is L, the 16 MHz clock signal ck12 is selected as the clock signal ck1.

The system clock signal cks is input to the frequency division circuit 103, and the frequency of this system clock signal cks is divided by a plurality of division ratios. Specifically, eight divided clock signals with the division ratios $2^0=1$, $2^1=2$, $2^2=4$, $2^3=8$, $2^4=16$, $2^5=32$, $2^6=64$, and $2^7=128$ are generated by the frequency division circuit 103.

The selector SEL2 selects the communication clock signal ckio of always 4 MHz from a plurality of divided clock signals output from the frequency division circuit 103 according to the first and second system clock selection signal ss11 and ss12 output from the operation core PE and the division ratio setting signal ss2 input via the register REG. The communication clock signal ckio is supplied to the IO unit IOU.

The first and second system clock selection signal ss11 and ss22 input to the selector SEL2 reveal which of the clock signals ck11, ck12, and ck2 is selected as the system clock cks. Therefore, at the same time when the system clock selection signal ss1 switches, the division ratio of the divided clock signal selected by the selector SEL2 is also switched, and the frequency of the communication clock signal ckio can be maintained to 4 MHz.

For example, when the system clock signal cks switches from the 32 MHz clock signal ck11 to the 4 MHz reference clock ck2, the selector SEL2 switches from the divided clock signal with the division ratio eight to select the divided clock signal with division ratio one according to the first and second system clock selection signal ss11 and ss12 that are input to the selector SEL2.

In a similar manner, for example when the system clock signal cks switches from the 16 MHz clock signal ck12 to the 4 MHz reference clock signal ck2, the selector SEL2 switches from the divided clock signal with the division ratio four to select the divided clock signal with the division ratio one according to the input first and second system clock selection signal ss11 and ss22.

That is, at the same time when the frequency of the system clock signal cks switches, the selector SEL2 can always select the 4 MHz divided clock signal as the communication clock signal ckio according to the input first and second system clock selection signal ss11 and ss12.

Figure 8:
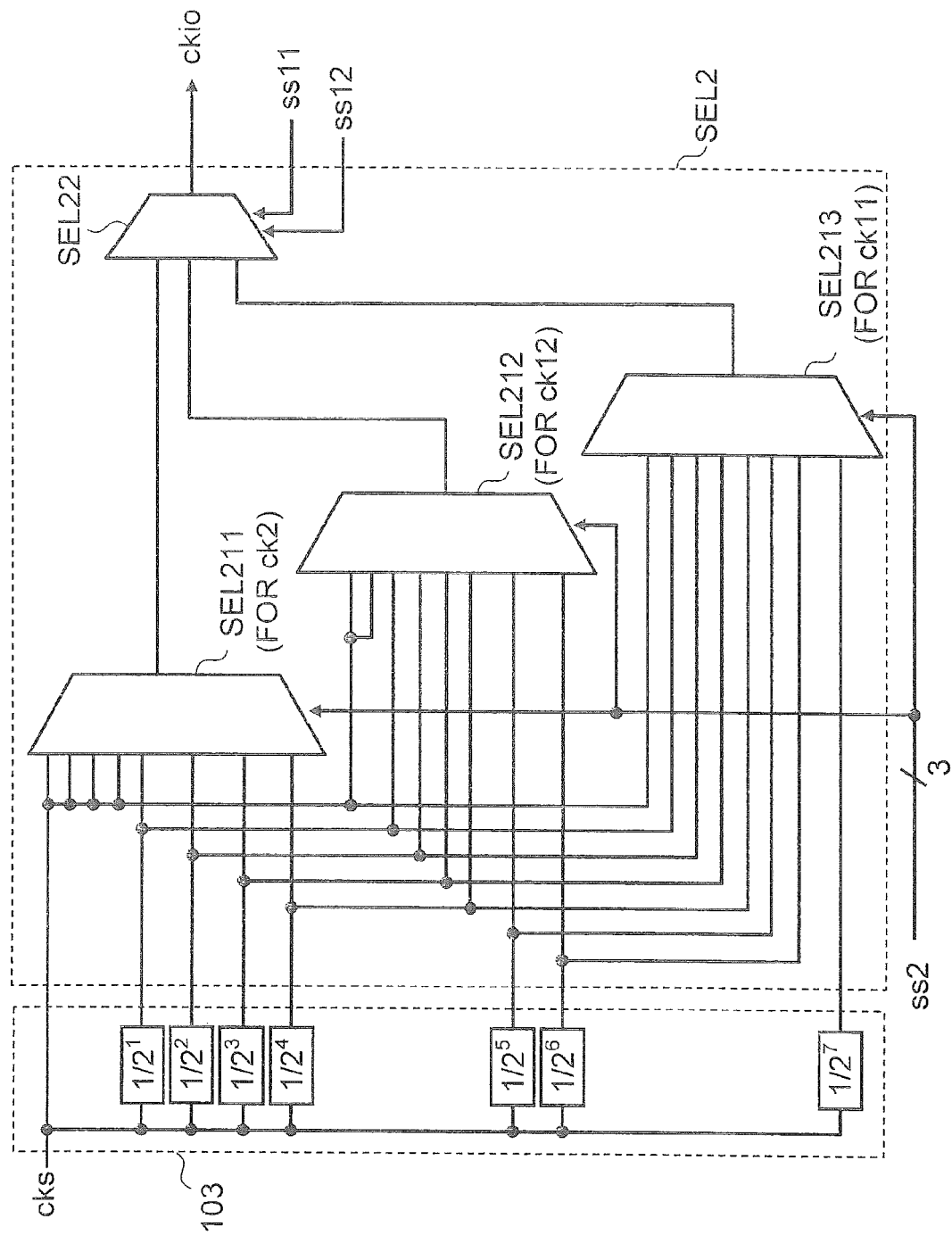
FIG. 8 is a circuit diagram showing a specific example of a selector SEL2 in FIG. 7.

Next, a specific example of the selector SEL2 is explained using FIG. 8. FIG. 8 is a circuit diagram showing the specific example of the selector SEL2 in FIG. 7. The selector SEL2 shown in FIG. 8 includes four selectors SEL211, SEL212, SEL213, and SEL22.

The selector SEL211 is selected by the subsequent stage selector SEL22 when the 4 MHz reference clock signal ck2 is selected as the system clock signal cks. Moreover, four signals of the division ratio $2^0=1$, one each signal of the division ratios $2^1=2$, $2^2=4$, $2^3=8$, and $2^4=16$, which are a total of eight divided clock signals, are input to the selector SEL211. Then, the selector SEL211 selects one clock signal from these eight divided clock signals according to the division ratio setting signal ss2 which is a three-bit register value corresponding to the eight divided clock signals.

The selector SEL212 is selected by the subsequent stage selector SEL22 when the 16 MHz reference clock signal ck12 is selected as the system clock signal cks. Further, two signals of the division ratio $2^0=1$, one each signal of the frequency division ratios $2^1=2$, $2^2=4$, $2^3=8$, $2^4=16$, $2^5=32$, and $2^6=64$, which are a total of eight divided clock signals, are input to the selector SEL212. Then, the selector SEL212 selects one clock signal from these eight divided clock signals according to the division ratio setting signal ss2 which is a three-bit register value corresponding to the eight divided clock signals.

The selector SEL213 is selected by the subsequent stage selector SEL22 when the 32 MHz reference clock signal ck11 is selected as the system clock signal cks. Further, one each signal of the division ratios $2^0=1$, $2^1=2$, $2^2=4$, $2^3=8$, $2^4=16$, $2^5=32$, $2^6=64$, and $2^7=128$, which are a total of eight divided clock signals, are input to the selector SEL213. Then, the selector SEL213 selects one clock signal from these eight divided clock signals according to the division ratio setting signal ss2 which is a three-bit register value corresponding to the eight divided clock signals.

As shown in FIG. 8, the division ratio setting signal ss2 which is a common register value is input to the selectors SEL211, SEL212, and SEL213.

The selector SEL22 selects one clock signal from three clock signals selected by the selectors SEL211, SEL212, and SEL213 as the communication clock signal ckio according to the input first and second system clock selection signal ss11 and ss12. As described above, when the 4 MHz reference clock signal ck2 is selected as the system clock signal cks, the selector SEL22 selects an output from the selector SEL211. When the 16 MHz clock signal ck12 is selected as the system clock signal cks, the selector SEL22 selects the output from the selector SEL212. When the 32 MHz clock signal ck11 is selected as the system clock signal cks, the selector SEL22 selects the output from the selector SEL213.

FIG. 9 is a table showing division ratios and frequencies in the selectors SEL211, SEL212, and SEL213 corresponding to the register value (division ratio setting signal ss2). Specifically, as shown in FIG. 9, as for the selector SEL211 for the 4 MHz reference clock signal ck2, the division ratio $2^0=1$ is assigned to the register values 000, 001, 010, and 011, the division ratio $2^1=2$ is assigned to the register value 100, the division ratio $2^2=4$ is assigned to the register value 101, and the division ratio $2^3=8$ is assigned to the register value 110, and the division ratio $2^4=16$ is assigned to the register value 111.

Therefore, when the 4 MHz reference clock signal ck2 is selected as the system clock signal cks, the frequency of the communication clock signal ckio will be as follows. With the register values 000, 001, 010, and 011, 4 MHz/1=4 MHz, with the register value 100, 4 MHz/2=2 MHz, with the register value 101, 4 MHz/4=1 MHz, with the register value 110, 4 MHz/8=0.5 MHz, and with the register value 111, 4 MHz/16=0.25 MHz.

As for the selector SEL212 for the 16 MHz clock signal ck12, the division ratio $2^0=1$ is assigned to the register values 000 and 001, the division ratio $2^1=2$ is assigned to the register value 010, the division ratio $2^2=4$ is assigned to the register value 011, the division ratio $2^3=8$ is assigned to the register value 100, the division ratio $2^4=16$ is assigned to the register value 101, the division ratio $2^5=32$ is assigned to the register value 110, and the division ratio $2^6=64$ is assigned to the register value 111.

Therefore, when the 16 MHz clock signal ck12 is selected as the system clock signal cks, the frequency of the communication clock signal ckio will be as follows. With the register values 000 and 001, 16 MHz/1=16 MHz, with the register value 010, 16 MHz/2=8 MHz, with the register value 011, 16 MHz/4=4 MHz, with the register value 100, 16 MHz/8=2 MHz, with the register value 101, 16 MHz/16=1 MHz, with the register value 110, 16 MHz/32=0.5 MHz, and with the register value 111, 16 MHz/64=0.25 MHz.

As for the selector SEL213 for the 32 MHz clock signal ck11, the division ratio $2^0=1$ is assigned to the register value 000, the division ratio $2^1=2$ is assigned to the register value 001, the division ratio $2^2=4$ is assigned to the register value 010, the division ratio $2^3=8$ is assigned to the register value 011, the division ratio $2^4=16$ is assigned to the register value 100, the division ratio $2^5=32$ is assigned to the register value 101, the division ratio $2^6=64$ is assigned to the register value 110, and the division ratio $2^7=128$ is assigned to the register value 111.

Therefore, when the 32 MHz clock signal ck11 is selected as the system clock signal cks, the frequency of the communication clock signal ckio will be as follows. With the register value 000, 32 MHz/1=32 MHz, with the register value 001, 32 MHz/2=16 MHz, with the register value 010, 32 MHz/4=8 MHz, with the register value 011, 32 MHz/8=4 MHz, with the register value 100, 32 MHz/16=2 MHz, with the register value 101, 32 MHz/32=1 MHz, with the register value 110, 32 MHz/64=0.5 MHz, and with the register value 111, 32 MHz/128=0.25 MHz.

As shown in FIG. 9, even when one of the clock signals is selected from the reference clock signal ck2, and the clock signals ck11 and ck12 as the system clock signal cks, the frequency of the communication clock signal ckio corresponding to register value 011 is 4 MHz, the frequency of the communication clock signal ckio corresponding to the register value 100 is 2 MHz, the frequency of the communication clock signal ckio corresponding to the register value 101 is 1 MHz, the frequency of communication clock signal ckio corresponding to the register value 110 is 0.5 MHz, and the frequency of the communication clock signal ckio corresponding to the register value 111 is 0.25 MHz. By such configuration, it is possible to maintain the frequency of the communication clock signal ckio to be the same value without changing the register value. That is, as indicated by the arrow in FIG. 9, with the register value 011, even when the system clock signal cks switches from the 32 MHz clock signal ck11 to the 4 MHz reference clock signal ck2, the frequency of the communication clock signal ckio is automatically maintained to 4 MHz.

Figure 10:
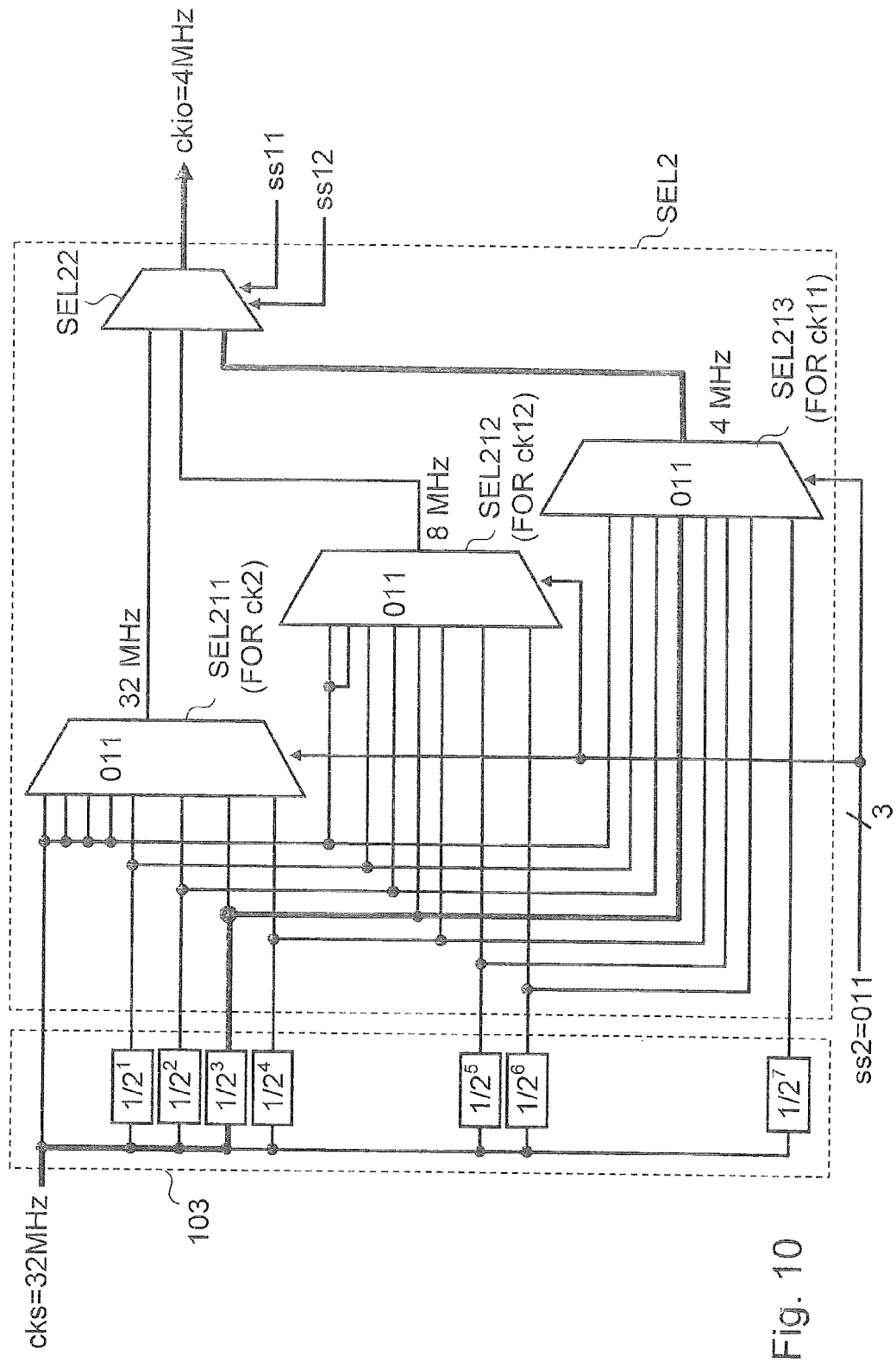
FIG. 10 is a view showing a case in which a 32 MHz clock signal ck11 is selected as a system clock signal cks.
Figure 11:
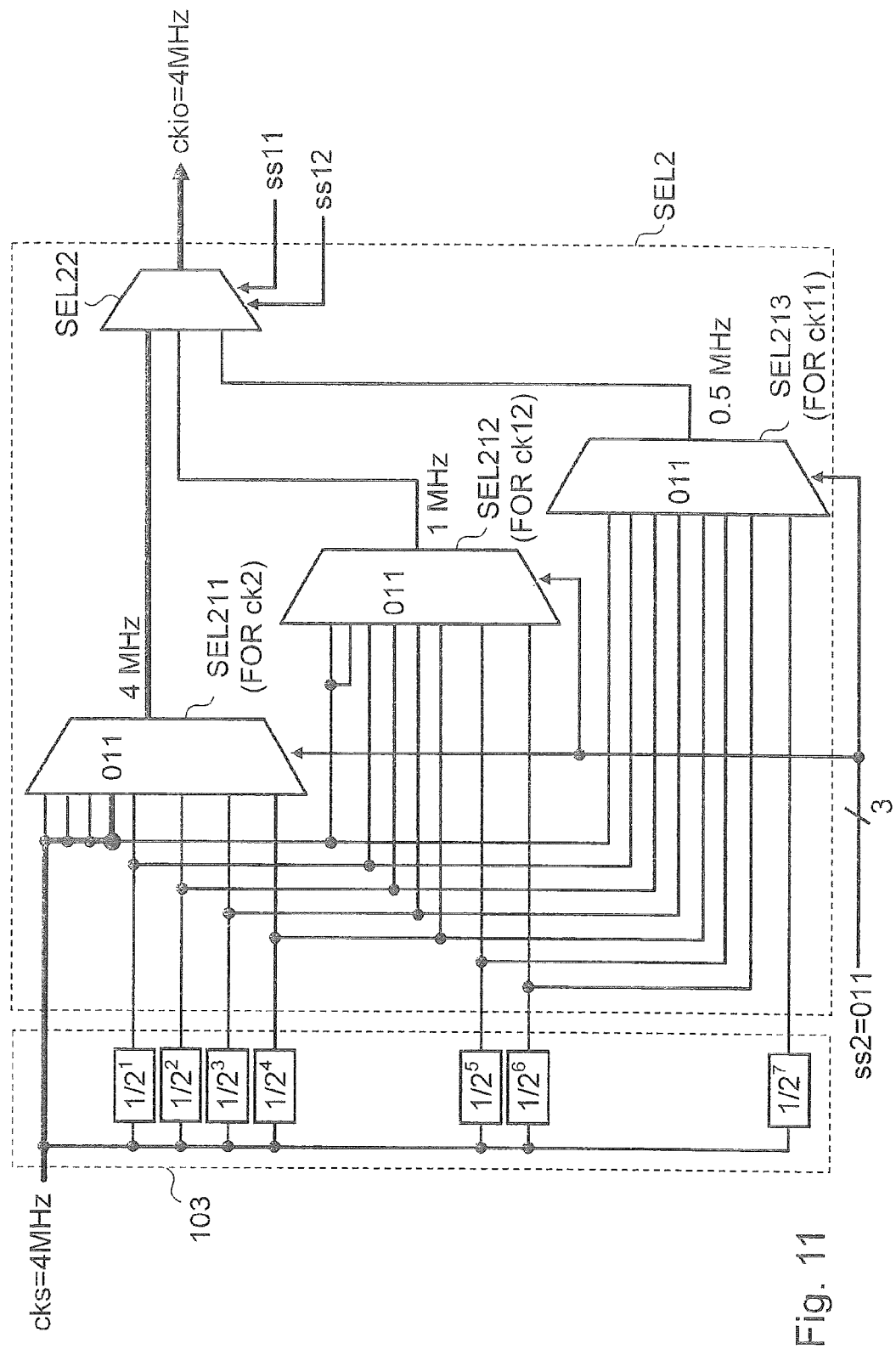
FIG. 11 is a view showing a case in which a 4 MHz reference clock ck2 is selected as the system clock signal cks.

A principle of automatically maintaining the frequency of the communication clock signal ckio is explained in further detail using a case of setting the register value in the table of FIG. 9 to 011 as an example, using FIGS. 10 and 11. FIG. 10 is a view showing a case when the 32 MHz clock signal ck11 is selected as the system clock signal cks in FIG. 8. FIG. 11 is a view showing a case when the 4 MHz reference clock signal ck2 is selected as the system clock signal cks in FIG. 8.

As shown in FIG. 10, when the 32 MHz clock signal ck11 is selected as the system clock signal cks, in the selector SEL211, the divided clock signal with the division ratio one is selected according to the register value 011, and a 32 MHz/1=32 MHz clock signal is output. In the selector SEL212, a signal with the division ratio four is selected according to the register value 011, and a 32 MHz/4=8 MHz clock signal is output. In the selector SEL213, a signal with the division ratio eight is selected according to the register value 011, and a 32 MHz/4=8 MHz clock signal is output. Then, in the selector SEL22, a 4 MHz clock signal output from the selector SEL213 is selected as the communication clock signal ckio according to the first and second system clock selection signal ss11 and ss12 indicating that the 32 MHz clock signal ck11 is selected as the system clock signal cks. In FIG. 10, the thick line indicates the flow of the clock signal to be selected.

As shown in FIG. 11, when the 4 MHz reference clock signal ck2 is selected as the system clock signal cks, in the selector SEL211, the divided clock signal with the division ratio one is selected according to the register value 011, and a 4 MHz/1=4 MHz clock signal is output. In the selector SEL212, the divided clock signal with the division ratio four is selected according to the register value 011, and a 4 MHz/4=1 MHz clock signal is output. In the selector SEL213, the divided clock signal with the division ratio eight is selected according to the register value 011, and a 4 MHz/8=0.5 MHz clock signal is output. Then, in the selector SEL22, the 4 MHz clock signal output from the selector SEL211 is selected as the communication clock signal ckio according to the first and second system clock selection signal ss11 and ss12 indicating that the 4 MHz clock signal ck2 is selected as the system clock signal cks. In FIG. 11, the thick line indicates the flow of the clock signal to be selected. By the above principle, the frequency of the communication clock signal ckio is automatically maintained.

Figure 12:
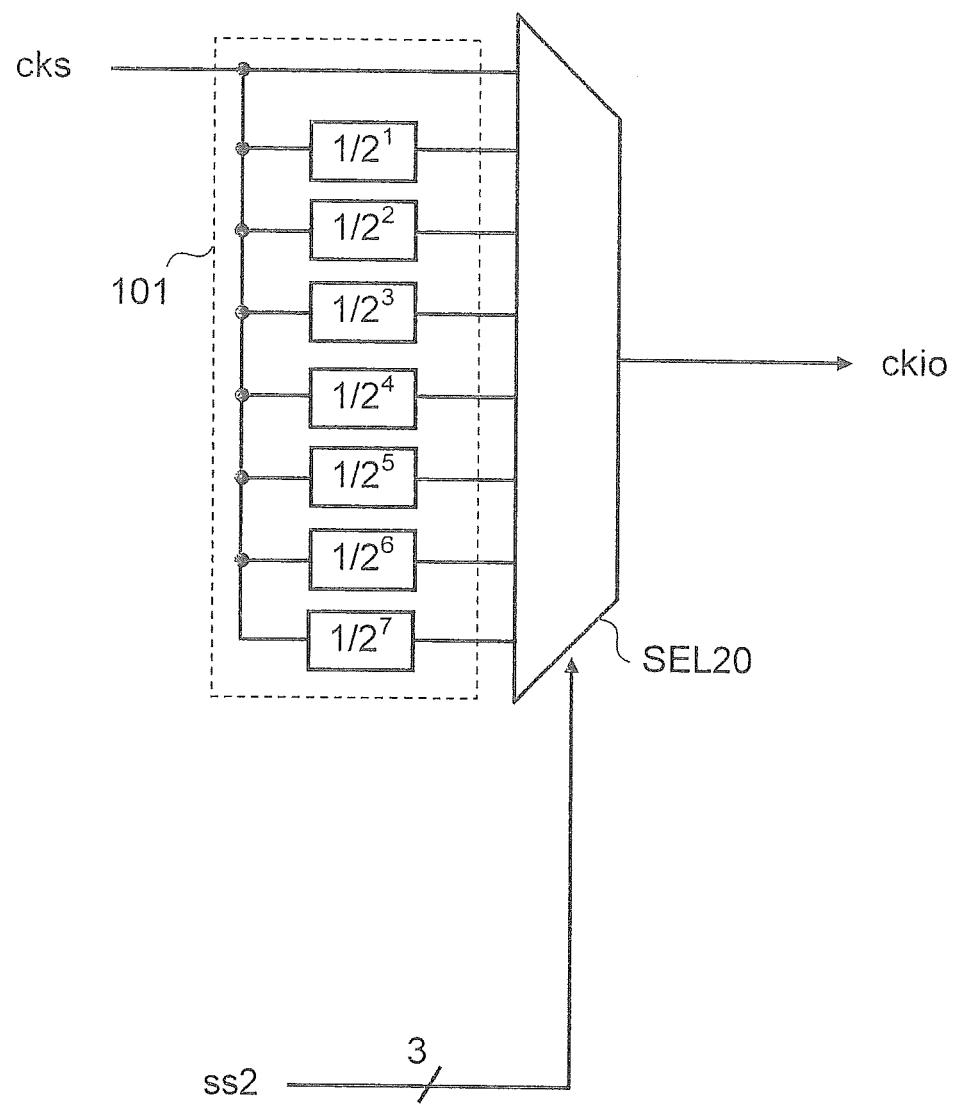
FIG. 12 is a circuit diagram showing a specific example of a selector SEL20 according to a comparative example.

Next, a specific example of the selector SEL20 according to the comparative example of FIG. 5 explained in the first embodiment is explained using FIG. 12. FIG. 12 is a circuit diagram showing the specific example of the selector SEL20 according to the comparative example. The selector SEL20 is one selector that has a configuration similar to the selectors SEL211, SEL212, and SEL213 in FIG. 8. Conversely, the selector SEL2 shown in FIG. 8 includes three selectors (the selectors SEL211, SEL212, and SEL213) having a similar configuration as the selector SEL20. Generally speaking, in the selector SEL2 according to this embodiment, the number of the selectors having the similar configuration as the selector SEL20 is the same as the number of frequencies that can be selected as the system clock signal cks.

One each signal of the division ratios $2^0=1$, $2^1=2$, $2^2=4$, $2^3=8$, $2^4=16$, $2^5=32$, $2^6=64$, and $2^7=128$, which is a total of eight divided clock signals are input to the selector SEL20. This is the same as the selector SEL213 in FIG. 8. Then, the selector SEL20 selects one clock signal from these eight divided clock signals according to the division ratio setting signal ss2 which is a three-bit register value corresponding to the eight divided clock signals.

FIG. 13 is a table showing division ratios and frequencies in the selector SEL20 corresponding to the register value (division ratio setting signal ss2). Specifically, as shown in FIG. 13, the division ratio $2^0=1$ is assigned to the register value 000, the division ratio $2^1=2$ is assigned to the register value 001, the division ratio $2^2=4$ is assigned to the register value 010, the frequency ratio $2^3=8$ is assigned to the register value 011, the division ratio $2^4=16$ is assigned to the register value 100, the division ratio $2^5=32$ is assigned to the register value 101, the division ratio $2^6=64$ is assigned to the register value 110, and the division ratio $2^7=128$ is assigned to the register value 111.

Therefore, when the 4 MHz reference clock signal ck11 is selected as the system clock signal cks, the frequency of the communication clock signal ckio will be as follows. With the register value 000, 4 MHz/1=4 MHz, with the register value 001, 4 MHz/2=16 MHz, with the register value 010, 4 MHz/4=1 MHz, with the register value 011, 4 MHz/8=0.5 MHz, with the register value 100, 4 MHz/16=0.25 MHz, with the register value 101, 4 MHz/32=125 kHz, with the register value 110, 4 MHz/64=62.5 kHz, and with the register value 111, 4 MHz/128=31.25 kHz.

When the 16 MHz clock signal ck12 is selected as the system clock signal cks, the frequency of the communication clock signal ckio will be as follows. With the register value 000, 16 MHz/1=16 MHz, with the register value 001, 16 MHz/2=8 MHz, with the register value 010, 16 MHz/4=4 MHz, with the register value 011, 16 MHz/8=2 MHz, with the register value 100, 16 MHz/16=1 MHz, with the register value 101, 16 MHz/32 0.5 MHz, with the register value 110, 16 MHz/64=0.25 MHz, and with the register value 111, 16 MHz/128=125 kHz.

When the 32 MHz clock signal ck11 is selected as the system clock signal cks, the frequency of the communication clock signal ckio will be as follows. With the register value 000, 32 MHz/1=32 MHz, with the register value 001, 32

MHz/2=16 MHz, with the register value 010, 32 MHz/4=8 MHz, with the register value 011, 32 MHz/8=4 MHz, with the register value 100, 32 MHz/16=2 MHz, with the register value 101, 32 MHz/32=1 MHz, with the register value 110, 32 MHz/64=0.5 MHz, and with the register value 111, 32 MHz/128=0.25 MHz.

Therefore, as shown in FIG. 13, unless the register value is changed according to the frequency of the clock signal selected as the system clock cks, the frequency of the communication clock signal ckio cannot be maintained to be the same. To be specific, a case is considered in which the frequency of the communication clock signal ckio is 4 MHz. As indicated by the arrow in FIG. 13, when the system clock signal cks is the 32 MHz clock signal ck11, the register value is 011. When the system clock signal cks switches to the 4 MHz reference clock signal ck2, the register value must be changed to 000. Usually, before switching a system clock, the output of the communication clock signal ckio is suspended, and after the register value is changed, the output of the communication clock signal is resumed. That is, there is a period generated that is not possible to communicate for a predetermined period.

Figure 14:
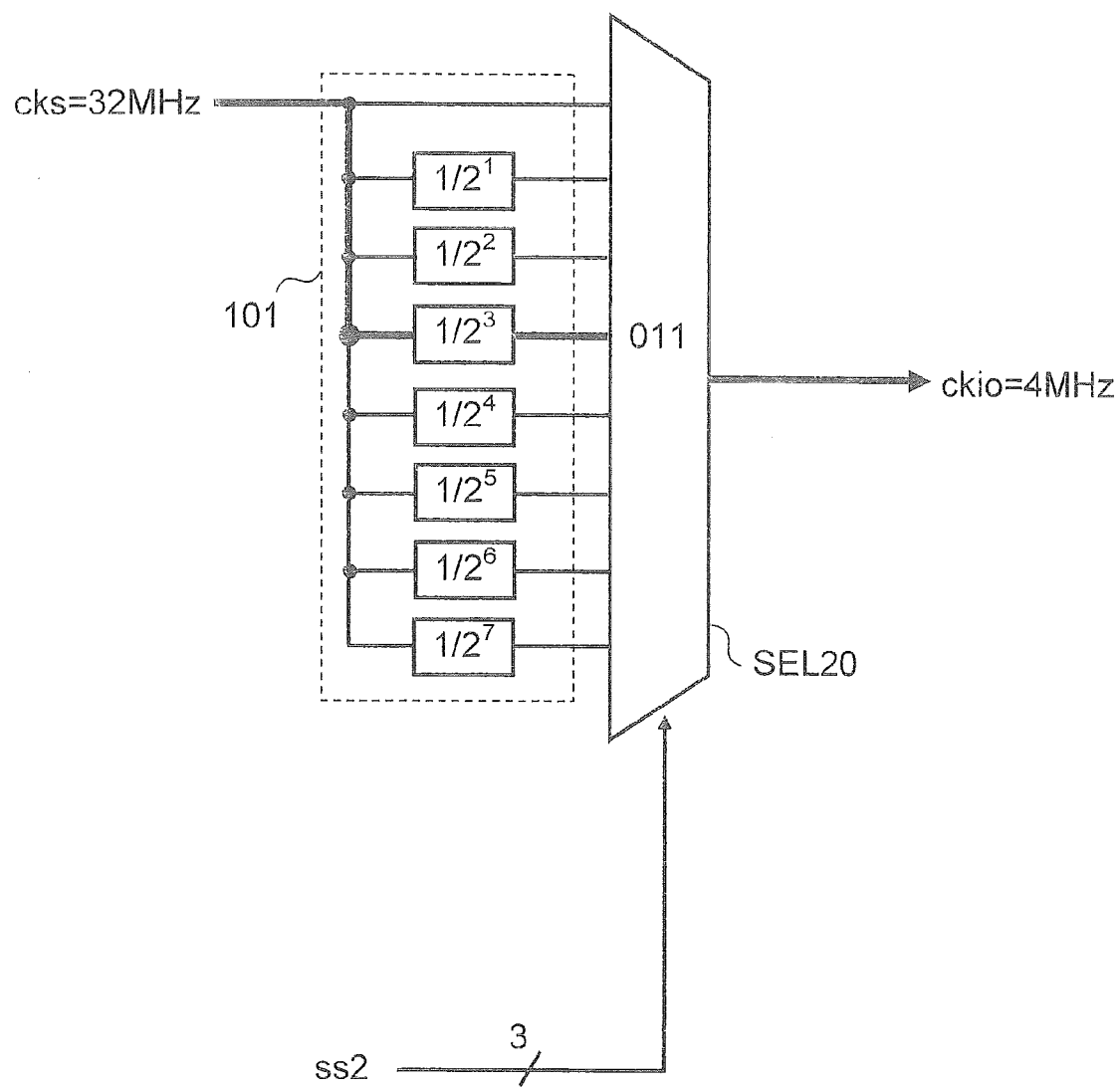
FIG. 14 is a view showing a case in which the 32 MHz clock signal ck11 is selected as the system clock signal cks.
Figure 15:
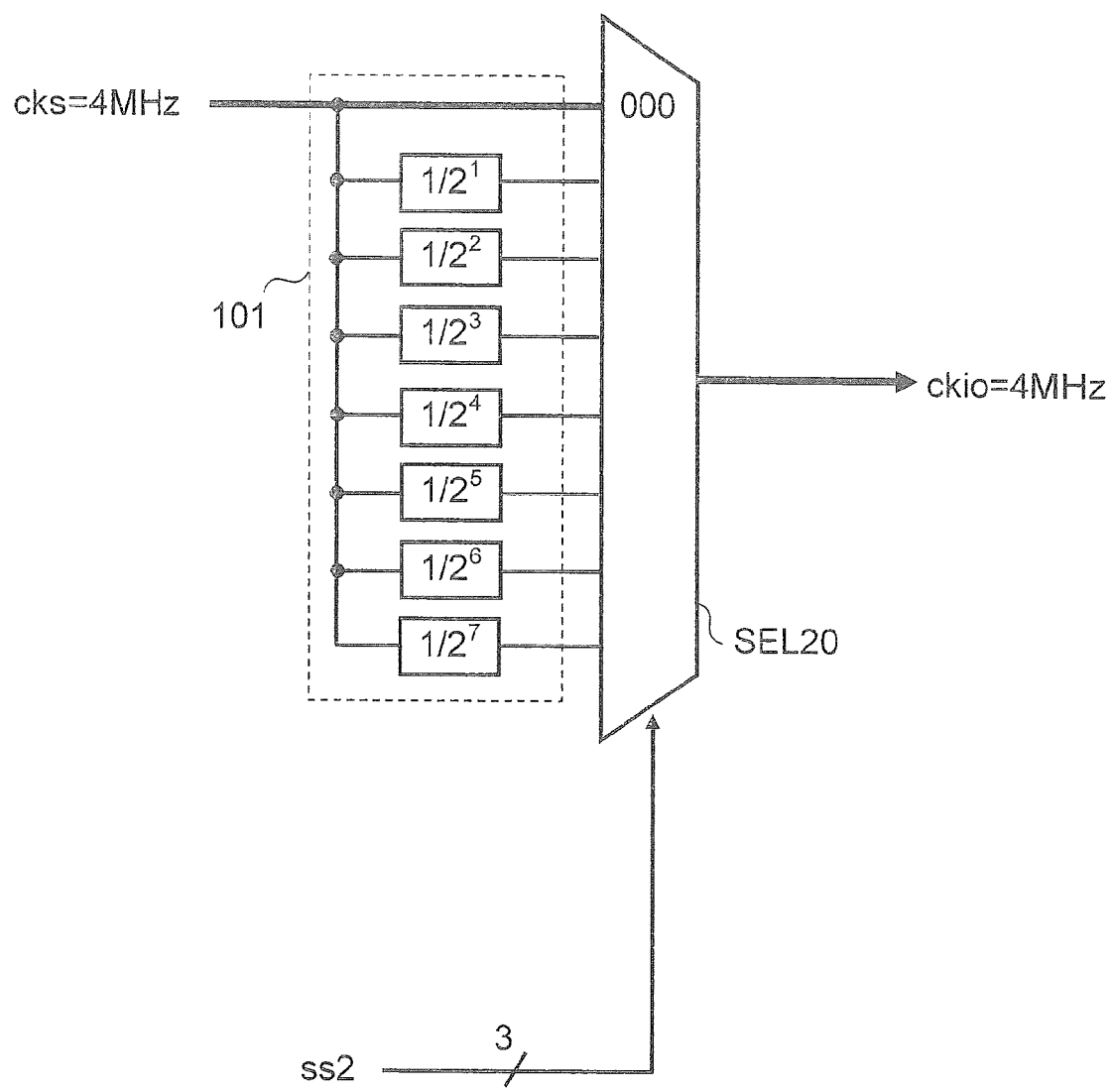
FIG. 15 is a view showing a case in which the 4 MHz reference clock ck2 is selected as the system clock signal cks.

A principle of maintaining the frequency of the communication clock signal ckio in the comparative example is explained in further detail using a case in which the frequency of the communication clock signal ckio in the table of FIG. 13 is 4 MHz as an example, using FIGS. 14 and 15. FIG. 14 is a view when the 32 MHz clock signal ck11 is selected as the system clock signal cks in FIG. 12. FIG. 15 is a view when the 4 MHz clock signal ck2 is selected as the system clock signal cks in FIG. 12.

As shown in FIG. 14, when the 32 MHz clock signal ck11 is selected as the system clock signal cks, in the selector SEL20, a signal with the division ratio eight is selected according to the register value 011, and a 32 MHz/8=4 MHz clock signal is output. In FIG. 14, the thick line indicates the flow of the clock signal to be selected.

As shown in FIG. 15, when switched to the 4 MHz reference clock ck2 as the system clock signal cks, in the selector SEL20, the register value changes from 011 to 000. The divided clock signal with the division ratio one is selected according to this register value 000, and a 4 MHz/1=4 MHz clock signal is output. In FIG. 15, the thick line indicates the flow of the clock signal selected.

Figure 16:
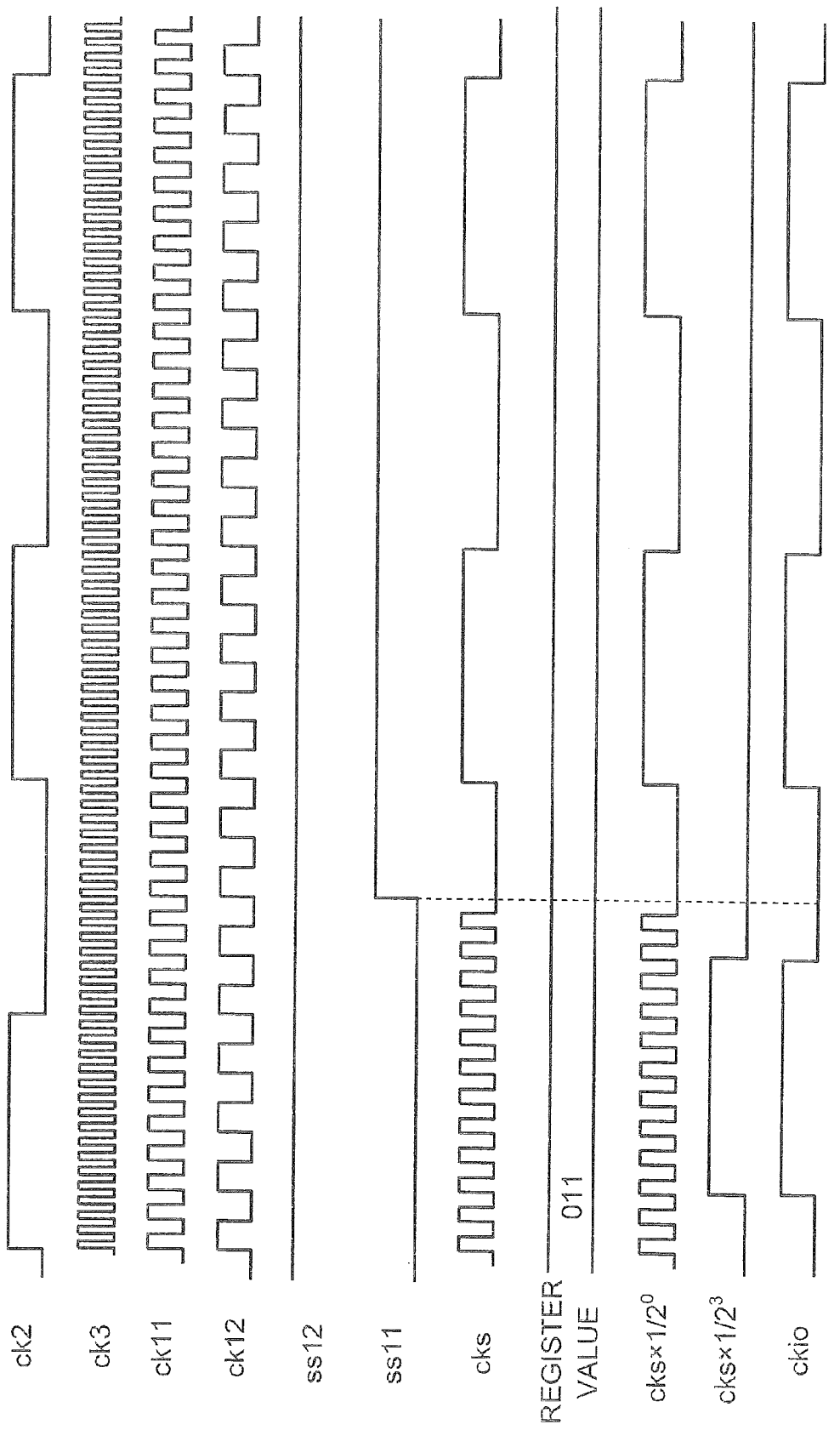
FIG. 16 is a timing chart for explaining an operation of the clock generation unit CG of FIG. 7.

Next, an operation of the clock generation unit CG according to this embodiment is explained using FIG. 16. FIG. 16 is a timing chart for explaining the operation of the clock generation unit CG of FIG. 7. From the top of FIG. 16, the reference clock signal ck2, the clock signal ck3, the clock signal ck11, the clock signal ck12, the second system clock selection signal ss12, the first system clock selection signal ss11, the system clock signal cks, the register value, a signal obtained by dividing the system clock signal cks by one, a signal obtained by dividing the system clock signal cks by eight, and the communication clock signal ckio are shown.

The reference clock signal ck2 shown in the first column of FIG. 16 is a clock signal with a frequency of 4 MHz output from the oscillator 101 as shown in FIG. 7. The clock signal ck3 shown in the second column is a clock signal with a frequency of 64 MHz that is obtained by multiplying the reference clock signal ck2 by 16 by the PLL circuit 102. The clock signal ck11 shown in the third column is the clock signal with a frequency of 32 MHz that is obtained by dividing the clock signal ck3 by two by the frequency division circuit 104a. The clock signal ck12 shown in the third column is the clock signal with a frequency of 16 MHz that is obtained by dividing the clock signal ck3 by four by the frequency division circuit 104b.

When the second system clock selection signal ss12 shown in the fifth column is L, the clock signal ck12 shown in the fourth column is selected by the selector SEL3. On the other hand, when the second system clock selection signal ss12 shown in the fifth column switches to H, the clock signal ck11 shown in the third column is selected by the selector SEL3.

When the first system clock selection signal ss11 shown in the sixth column is L, the clock signal ck11 shown in the third column or the clock signal ck12 shown in the fourth column as the system clock signal cks shown in the seventh column is selected by the selector SEL1. On the other hand, when the first system clock selection signal ss11 shown in the sixth column switches to H, the reference clock signal ck2 shown in the first column as the system clock signal cks shown in the seventh column is selected by the selector SEL1. The register value 011 shown in the eighth column is input to the selectors SEL211, SEL212, and SEL213 shown in FIG. 8.

"The signal obtained by dividing the system clock signal cks by one" shown in the ninth column and "the signal obtained by dividing the system clock signal cks by eight" shown in the tenth column are generated by the frequency division circuit 103. When the second system clock selection signal ss12 shown in the fifth column is H and the first system clock selection signal ss11 shown in the sixth column is L, "the signal obtained by dividing the system clock signal cks by eight" shown in the tenth column is selected by the selector SEL2 as the communication clock signal ckio shown in the eleventh column (bottom column). On the other hand, when the first system clock selection signal ss11 shown in the sixth column switches to H, "the signal obtained by dividing the frequency of the system clock signal cks by one" shown in the ninth column is selected by the selector SEL2 as the communication clock signal ckio shown in the eleventh column (bottom column).

As shown in FIG. 16, in the clock generation unit CG according to this embodiment, at the same time when the first system clock selection signal ss11 shown in the sixth column switches, the division ratio of the divided clock signal selected by the selector SEL2 can be switched. Note that at the time of switch, although there may be a deviation for one cycle at most could be generated in the communication clock signal ckio depending on the switching timing, the deviation is within the communication error range, and thereby not causing a problem.

Third Embodiment

Figure 17:
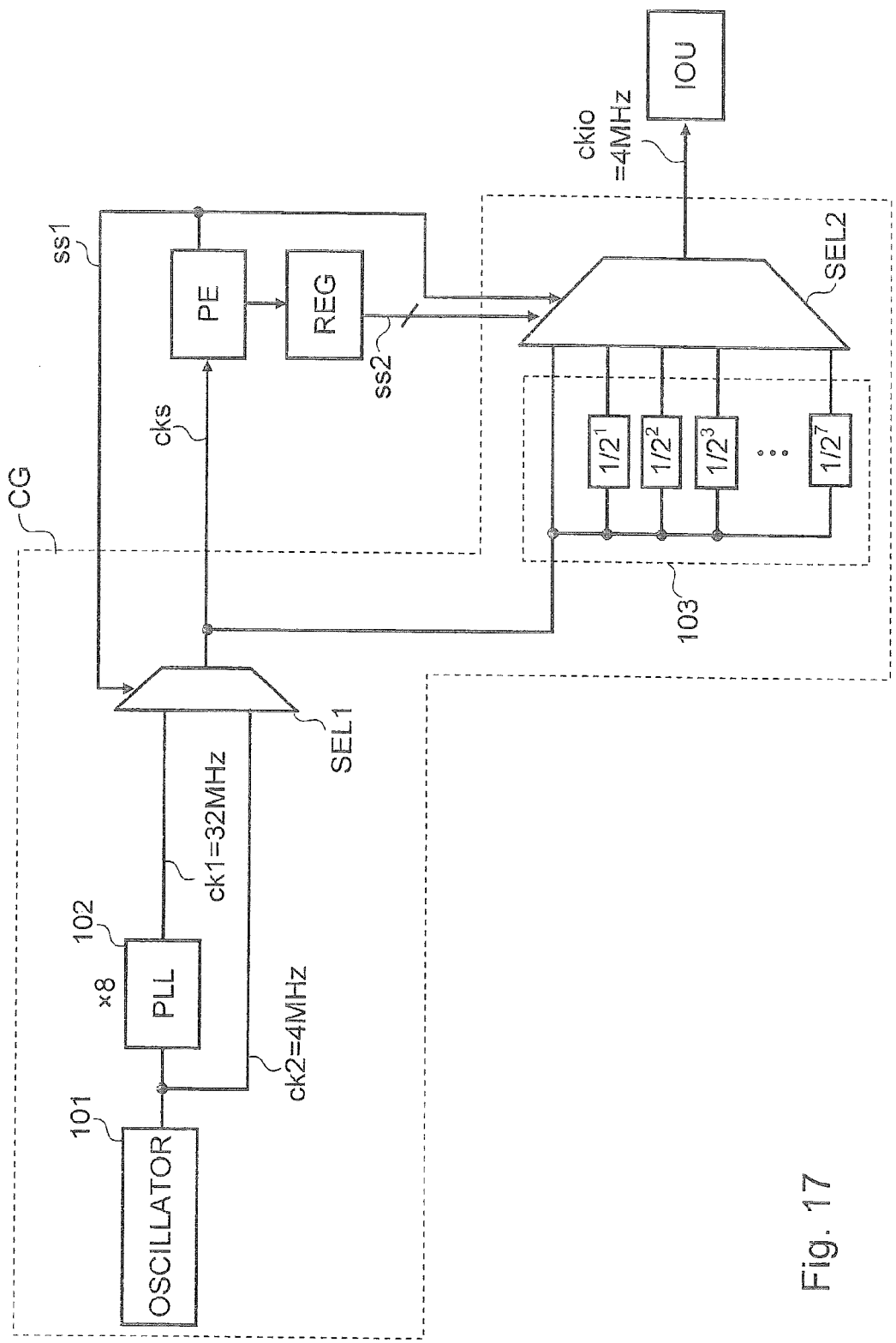
FIG. 17 is a block diagram of a clock generation unit CG according to a third embodiment.

Next, a clock generation unit CG according to a third embodiment is explained using FIG. 17. FIG. 17 is a block diagram of the clock generation unit CG according to the third embodiment. As shown in FIG. 17, the clock generation unit CG according to the third embodiment has a configuration in which the frequency division circuits 104a and 104b, and the selector SEL3 are removed from the clock generation unit CG of FIG. 7 according to the second embodiment.

In FIG. 17, suppose that, for example, the 4 MHz reference clock signal ck2 is output from the oscillator 101. The PLL circuit 102 multiplies, for example, the reference clock signal ck2 output from the oscillator 101 by eight, and generates the 4×8=32 MHz clock signal ck1.

The selector SEL1 selects the system clock signal cks from the reference clock signal ck2 and the clock signal ck1 according to the system clock selection signal ss1 output from the operation core PE. The system clock signal cks is supplied to the operation core PE.

The system clock selection signal ss1 switches according to the operation mode. For example, in the normal operation mode, the system clock selection signal ss1 is set to L, and the high-speed clock signal ck1 is selected as the system clock signal cks. On the other hand, in the low consumption mode, the system clock selection signal ss1 is set to H, and the low-speed reference clock signal ck2 is selected as the system clock signal cks.

Since the configuration of the frequency division circuit 103 is the same as that of the second embodiment, the explanation is omitted.

The selector SEL2 selects the communication clock signal ckio of always 4 MHz from a plurality of divided clock signals output from the frequency division circuit 103 according to the system clock selection signal ss1 output from the operation core PE and the division ratio setting signal ss2 input via the register REG. The communication clock signal ckio is supplied to the IO unit IOU.

Figure 18:
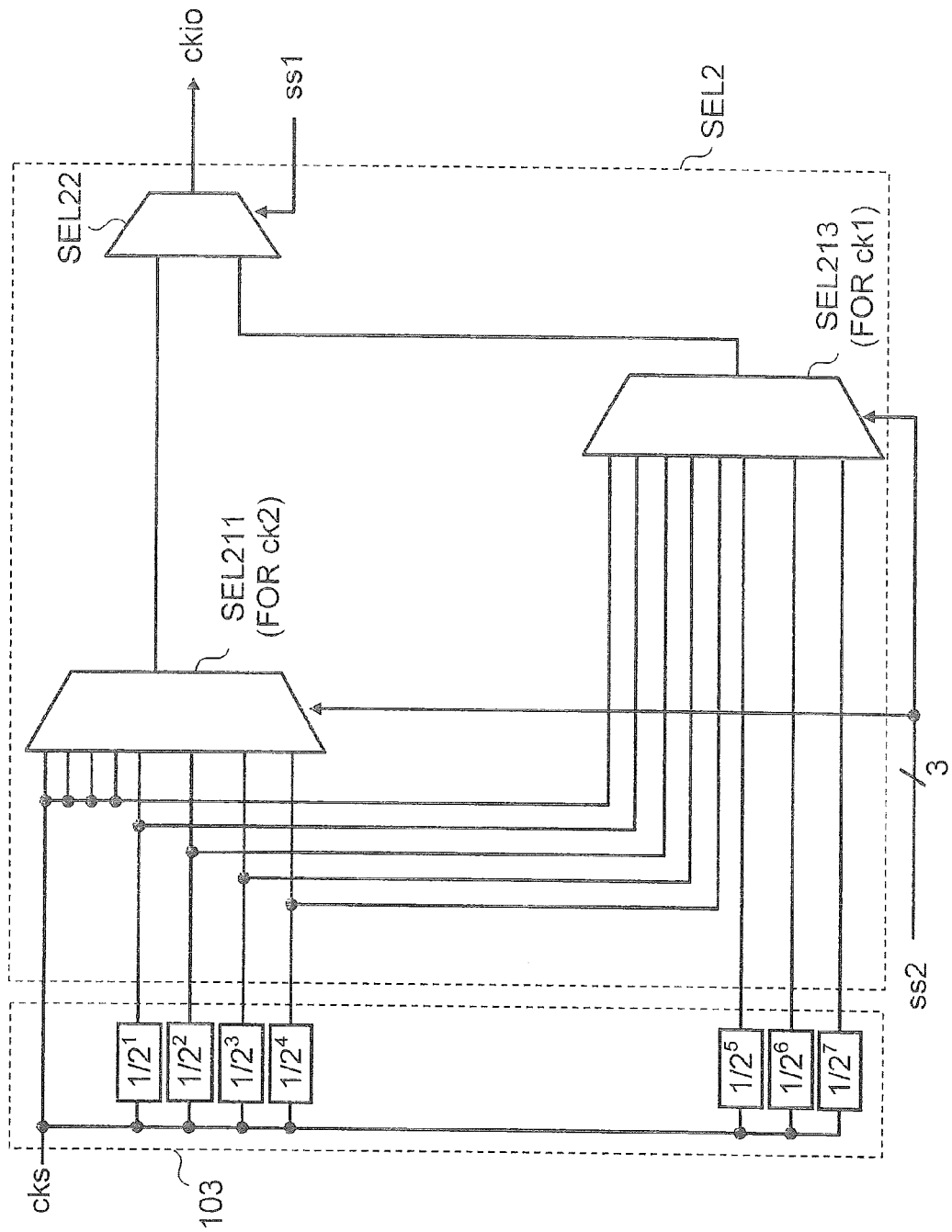
FIG. 18 is a circuit diagram showing a specific example of a selector SEL2 in FIG. 17.

Next, a specific example of the selector SEL2 is explained using FIG. 18. FIG. 18 is a circuit diagram showing the specific example of the selector SEL2 in FIG. 17. The selector SEL2 shown in FIG. 18 includes three selectors SEL211, SEL213, and SEL22. That is, the selector SEL2 shown in FIG. 18 has a configuration in which the selector SEL212 is removed from SEL2 according to the second embodiment shown in FIG. 8.

Since the configuration of the selectors SEL211 and SEL213 is the same as that of the second embodiment, the explanation is omitted.

The selector SEL22 selects one clock signal from two clock signals selected by the selectors SEL211 and SEL213 as the communication clock signal ckio according to the input system clock selection signal ss1. As described above, when the 4 MHz reference clock signal ck2 is selected as the system clock signal cks, the selector SEL22 selects the output from the selector SEL211. When the 32 MHz clock signal ck1 is selected as the system clock signal cks, the selector SEL22 selects the output from the selector SEL213.

In the clock generation unit CG according to the above first to third embodiments, the system clock selection signal ss1 (ss11 and ss12) is input also to the selector SEL2. Therefore, at the same time when the frequency of the system clock signal cks switches, the division ratio selected by the selector SEL2 also switches, so that the frequency of the communication clock signal ckio can be maintained. Accordingly, there is no period generated that is not possible to communicate, and excellent communication responsiveness is achieved.

Although the present invention is explained with reference to the embodiments, the present invention is not limited by above. Various modifications that can be understood by a person in the art can be made to the configuration and details of the present invention within the scope of the present invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A microcomputer comprising:
a register that stores division ratio setting information;
a frequency divider that determines first and second division ratios based on the division ratio setting information, frequency-divides a first clock having a first frequency at the first division ratio, and frequency-divides a second clock having a second frequency at the second division ratio; and
a CPU (central processing unit) connected to the register and the frequency divider,
wherein the first frequency is lower than the second frequency,
wherein when the division ratio setting information indicates a frequency higher than the first frequency, the first division ratio is set to 1 and the second division ratio is set based on the division ratio setting information, and
wherein when the division ratio setting information indicates a frequency equal to or lower than the first frequency, the first and second division ratios are determined in such a manner that a frequency of the first clock that is frequency-divided at the first division ratio and a frequency of the second clock that is frequency-divided at the second division ratio are made equal to each other.

2. The microcomputer according to claim 1, wherein when the division ratio setting information indicates the frequency equal to or lower than the first frequency, the frequency divider selects the first and second division ratios from among N (N is a natural number equal to or more than two) different division ratios based on the division ratio setting information so that the frequency of the first clock that is frequency-divided at the first division ratio and the frequency of the second clock that is frequency-divided at the second division ratio are made equal to each other.

3. The microcomputer according to claim 1, wherein the frequency divider determines which one of the first and second clocks to frequency-divide, based on a frequency-divided clock selection signal output from the CPU.

4. The microcomputer according to claim 3, wherein the frequency divider selects the first division ratio when the first clock is selected, and selects the second division ratio when the second clock is selected, according to the frequency-divided clock selection signal.

5. The microcomputer according to claim 4, wherein the division ratio setting information is constant when a clock to be frequency-divided by the frequency divider switches from the first clock to the second clock based on the frequency-divided clock selection signal.

6. The microcomputer according to claim 1, further comprising an IO unit that receives a clock output from the frequency divider.

7. The microcomputer according to claim 1, wherein when the division ratio setting information indicates the frequency equal to or lower than the first frequency, the frequency divider selects the first and second division ratios from among a plurality of different division ratios based on the division ratio setting information so that the frequency of the first clock and the frequency of the second clock are made equal to each other.

8. The microcomputer according to claim 1, wherein the frequency divider determines which one of the first and second clocks to frequency-divide, based on the CPU.

9. The microcomputer according to claim 1, wherein the first and second division ratios are dynamically determined.

10. A microcomputer comprising:
a register that stores division ratio setting information;
a frequency divider that determines first, second and third division ratios based on the division ratio setting information, frequency-divides a first clock having a first frequency at the first division ratio, frequency-divides a second clock having a second frequency at the second division ratio, and frequency-divides a third clock having a third frequency at the third division ratio; and
a CPU (central processing unit) connected to the register and the frequency divider,
wherein the first frequency is lower than the second and third frequencies,
wherein when the division ratio setting information indicates a frequency higher than the first frequency, the first division ratio is set to 1 and the second and third division ratios are set based on the division ratio setting information, and
wherein when the division ratio setting information indicates a frequency equal to or lower than the first frequency, the first, second, and third division ratios are determined in such a manner that a frequency of the first clock that is frequency-divided at the first division ratio, a frequency of the second clock that is frequency-divided at the second division ratio, and a frequency of the third clock that is frequency-divided at the third division ratio are made equal to each other.

11. The microcomputer according to claim 10, wherein when the division ratio setting information indicates the frequency equal to or lower than the first frequency, the frequency divider selects the first, second, and third division ratios from among N (N is a natural number equal to or more than two) different division ratios based on the division ratio setting information so that the frequency of the first clock that is frequency-divided at the first division ratio, the frequency of the second clock that is frequency-divided at the second division ratio, and the frequency of the third clock that is frequency-divided at the third division ratio are made equal to each other.

12. The microcomputer according to claim 10, wherein the frequency divider determines which one of the first, second, and third clocks to frequency-divide, based on a frequency-divided clock selection signal output from the CPU.

13. The microcomputer according to claim 12, wherein the frequency divider selects the first division ratio when the first clock is selected, selects the second division ratio when the second clock is selected, and selects the third division ratio when the third clock is selected, according to the frequency-divided clock selection signal.

14. The microcomputer according to claim 13, wherein the division ratio setting information is constant when a clock to be frequency-divided at the frequency divider switches from the first clock to the second or third clock based on the frequency-divided clock selection signal.

15. The microcomputer according to claim 10, further comprising an IO unit that receives a clock output from the frequency divider.

16. A clock generation circuit comprising:
a register that stores division ratio setting information; and
a frequency divider that determines first and second division ratios based on the division ratio setting information, frequency-divides a first clock having a first frequency at the first division ratio, and frequency-divides a second clock having a second frequency at the second division ratio,
wherein the first frequency is lower than the second frequency,
wherein when the division ratio setting information indicates a frequency higher than the first frequency, the first division ratio is set to 1 and the second division ratio is set based on the division ratio setting information, and
wherein when the division ratio setting information indicates a frequency equal to or lower than the first frequency, the first and second division ratios are determined in such a manner that a frequency of the first clock that is frequency-divided at the first division ratio and a frequency of the second clock that is frequency-divided at the second division ratio are made equal to each other.

17. The clock generation circuit according to claim 16, wherein when the division ratio setting information indicates the frequency equal to or lower than the first frequency, the frequency divider selects the first and second division ratios from among N (N is a natural number equal to or more than two) different division ratios based on the division ratio setting information so that the frequency of the first clock that is frequency-divided at the first division ratio and the frequency of the second clock that is frequency-divided at the second division ratio are made equal to each other.

18. The clock generation circuit according to claim 16, wherein the frequency divider further determines a third division ratio based on the division ratio setting information, and frequency-divides a third clock having a third frequency at the third division ratio,
wherein the first frequency is lower than the second and third frequencies, wherein when the division ratio setting information indicates the frequency higher than the first frequency, the first division ratio is set 1 and the second and third division ratios are set based on the division ratio setting information, and
wherein when the division ratio setting information indicates the frequency equal to or lower than the first frequency, the first, second, and third division ratios are determined in a such manner that the frequency of the first clock that is frequency-divided at the first division ratio, the frequency of the second clock that is frequency-divided at the second division ratio, and a frequency of the third clock that is frequency-divided at the third division ratio are made equal to each other.

* * * * *